(12) United States Patent
Shieh et al.

(10) Patent No.: US 7,989,355 B2
(45) Date of Patent: Aug. 2, 2011

(54) METHOD OF PITCH HALVING

(75) Inventors: Ming-Feng Shieh, Yongkang (TW);
Shinn-Sheng Yu, Hsinchu (TW);
Anthony Yen, Jhubei (TW);
Ming-Ching Chang, Hsin-Chu (TW);
Jeff J. Xu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 255 days.

(21) Appl. No.: 12/370,152

(22) Filed: Feb. 12, 2009

(65) Prior Publication Data

US 2010/0203734 A1    Aug. 12, 2010

(51) Int. Cl.
*H01L 21/302* (2006.01)
*H01L 21/461* (2006.01)

(52) U.S. Cl. ........ 438/736; 438/706; 438/738; 438/947; 257/E21.035; 257/E21.036; 257/E21.038

(58) Field of Classification Search ............. 438/706, 438/736, 738, 947; 257/E21.035, E21.036, 257/E21.038
See application file for complete search history.

(56) References Cited

U.S. PATENT DOCUMENTS

| | | | |
|---|---|---|---|
| 6,706,571 B1 | 3/2004 | Yu et al. | |
| 6,734,107 B2 | 5/2004 | Lai et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,291,560 B2 | 11/2007 | Parascandola et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 7,749,913 B2 * | 7/2010 | Omura et al. | 438/706 |
| 2005/0153490 A1 | 7/2005 | Yoon et al. | |
| 2006/0258162 A1 | 11/2006 | Abatchev et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0161251 A1 | 7/2007 | Tran et al. | |
| 2007/0228372 A1 | 10/2007 | Yang et al. | |

(Continued)

OTHER PUBLICATIONS

Bartlomiej Jan Pawlak, et al., U.S. Appl. No. 12/569,689, "Method of Fabricating Finfet Device," filed Sep. 29, 2009, 21 pages.

(Continued)

*Primary Examiner* — Matthew C Landau
*Assistant Examiner* — Vicki B Booker
(74) *Attorney, Agent, or Firm* — Haynes and Boone, LLP

(57) ABSTRACT

The present disclosure provides a method of fabricating a semiconductor device that includes forming a mask layer over a substrate, forming a dummy layer having a first dummy feature and a second dummy feature over the mask layer, forming first and second spacer roofs to cover a top portion of the first and second dummy features, respectively, and forming first and second spacer sleeves to encircle side portions of the first and second dummy features, respectively, removing the first spacer roof and the first dummy feature while protecting the second dummy feature, removing a first end portion and a second end portion of the first spacer sleeve to form spacer fins, and patterning the mask layer using the spacer fins as a first mask element and the second dummy feature as a second mask element.

20 Claims, 25 Drawing Sheets

U.S. PATENT DOCUMENTS

| | | | |
|---|---|---|---|
| 2007/0241414 | A1 | 10/2007 | Narihiro |
| 2008/0258228 | A1 | 10/2008 | Chuang et al. |
| 2008/0263492 | A1 | 10/2008 | Chuang et al. |
| 2008/0290470 | A1 | 11/2008 | King et al. |
| 2008/0296632 | A1 | 12/2008 | Moroz et al. |
| 2009/0035909 | A1 | 2/2009 | Chang et al. |
| 2009/0181477 | A1 | 7/2009 | King et al. |
| 2010/0006945 | A1 | 1/2010 | Merelle et al. |
| 2010/0006974 | A1 | 1/2010 | Xu et al. |
| 2010/0052059 | A1 | 3/2010 | Lee |
| 2010/0183961 | A1 | 7/2010 | Shieh et al. |
| 2010/0264468 | A1 | 10/2010 | Xu |

OTHER PUBLICATIONS

Hsien-Hsin Lin, et al., U.S. Appl. No. 12/703,918, "Method for Fabricating a Finfet Device," filed Feb. 11, 2010, 40 pages.

Chien-Chang Su, et al., U.S. Appl. No. 12/644,869, "Method for Incorporating Impurity Element in EPI Silicon Process," filed Dec. 22, 2009, 21 pages.

Tsung-Lin Lee, et al., U.S. Appl. No. 12/622,038, "Sacrificial Offset Protection Film for a Finfet Device," filed Nov. 19, 2009, 56 pages.

Jeff J. Xu, et al., U.S. Appl. No. 12/784,207, "Method of Forming EPI Film in Substrate Trench," filed May 20, 2010, 33 pages.

Tian-Choy, et al., U.S. Appl. No. 12/756,552, "Hybrid Gate Process for Fabricating Finfet Device," filed Apr. 8, 2010, 38 pages.

Ming-Lung Cheng, et al. U.S. Appl. No. 12/780,124, "Method and Apparatus for Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit for Finfet Devices," filed Jun. 30, 2010, 32 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12/840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Jeff J. Csu, et al, U.S. Appl. No. 12/917,902, "Fin-Like Field Effect Transistor (FINFET) Device and Method of Manufacturing Same," filed Nov. 2, 2010, 61 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al, U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

\* cited by examiner

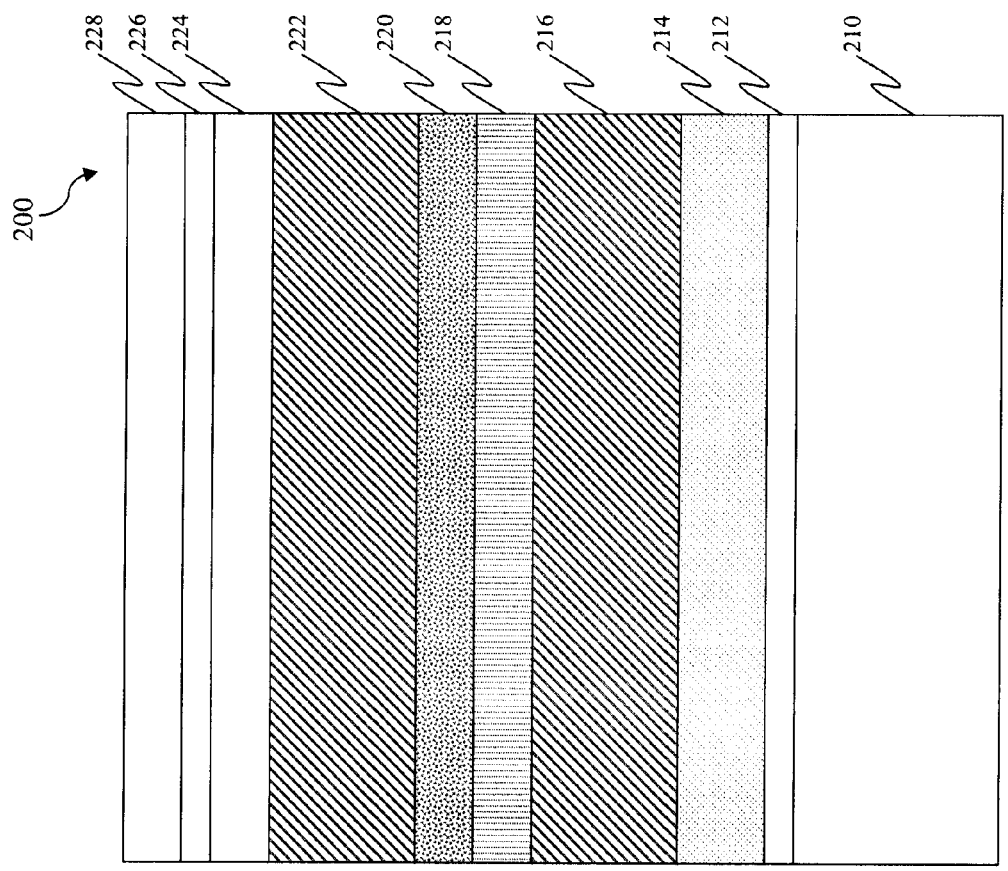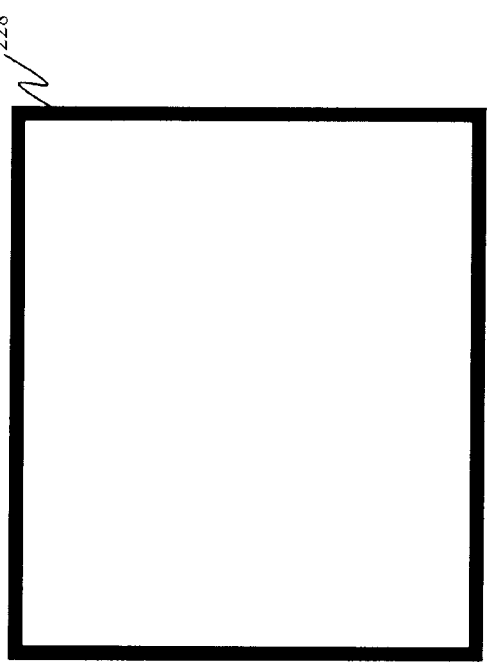
Fig. 2

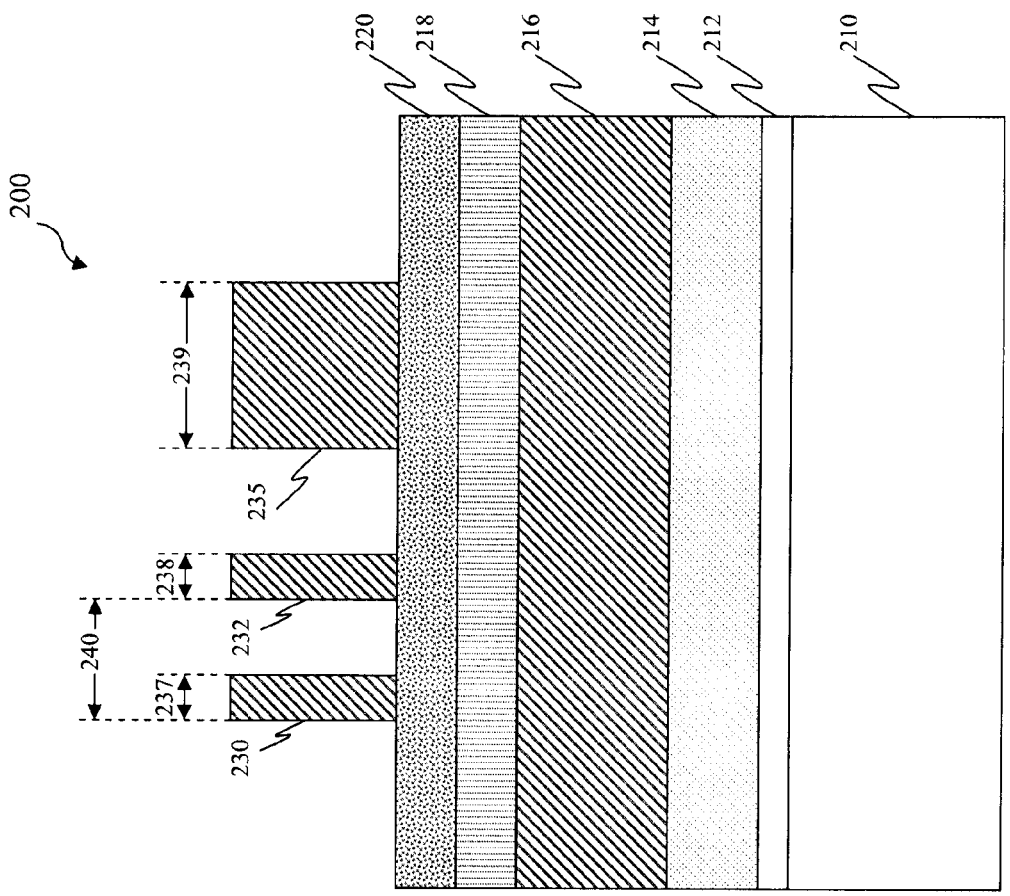
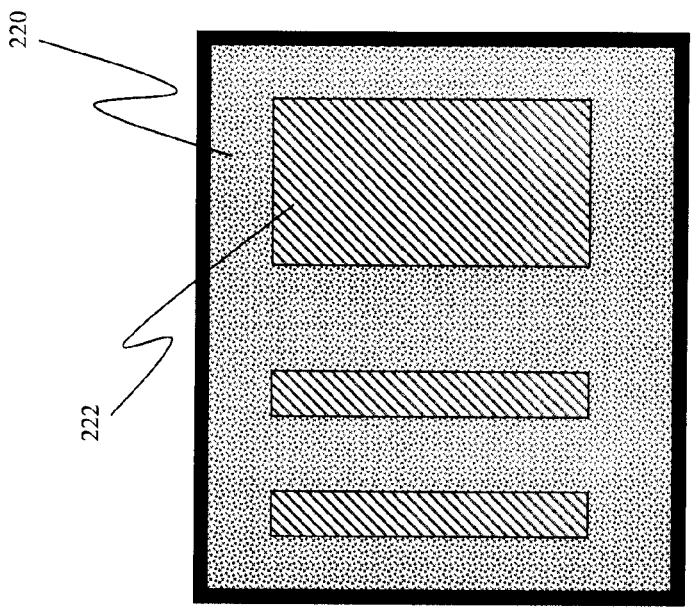
Fig. 6

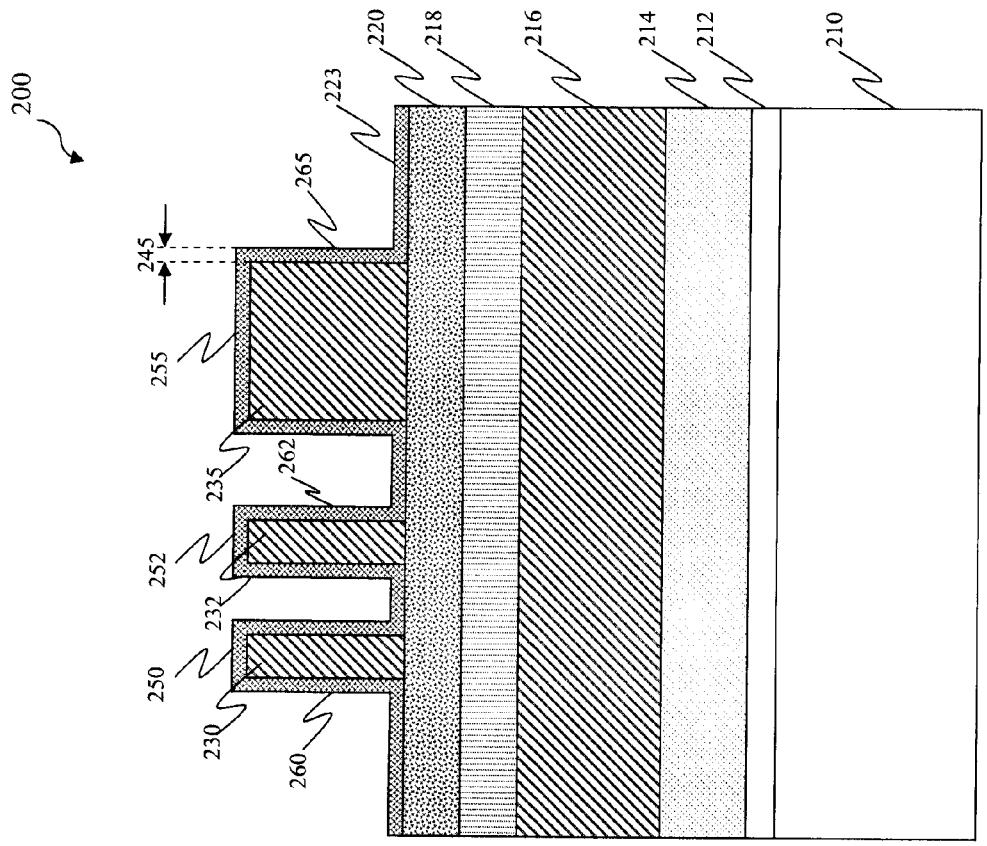
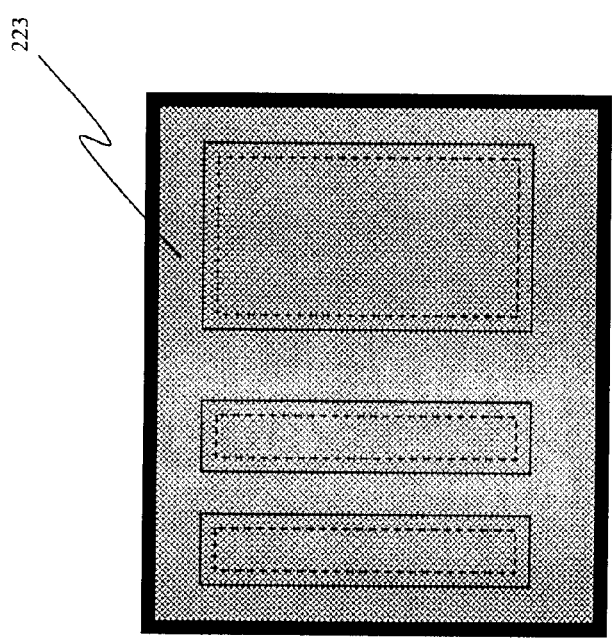
Fig. 7

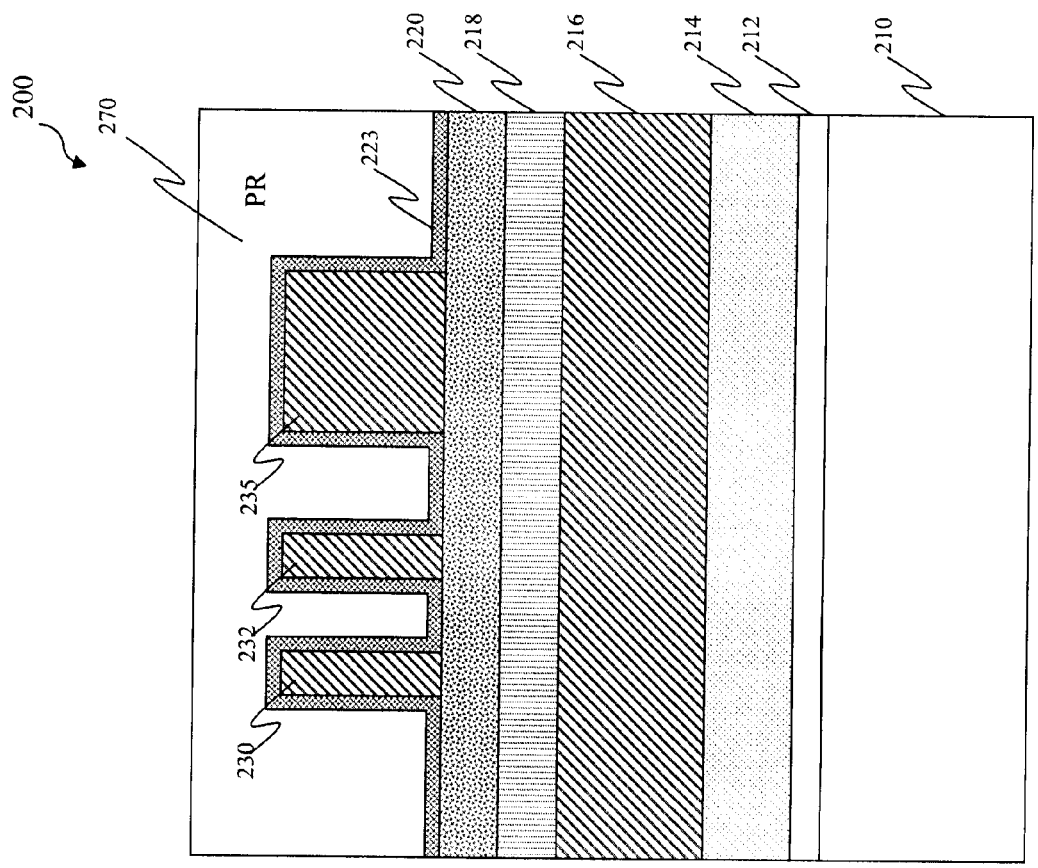
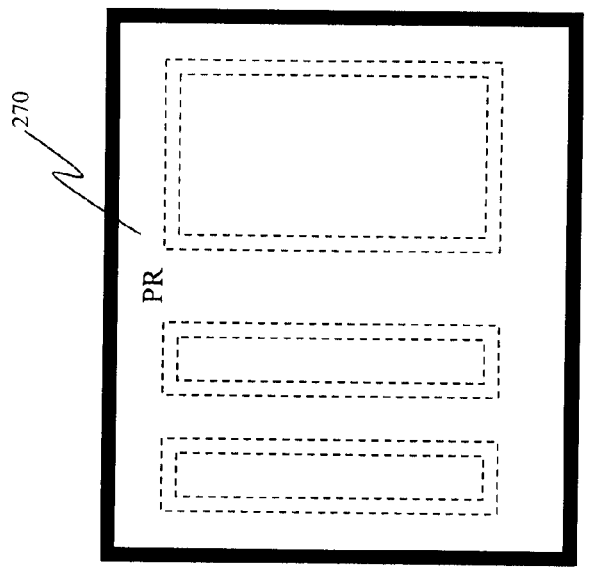
Fig. 8

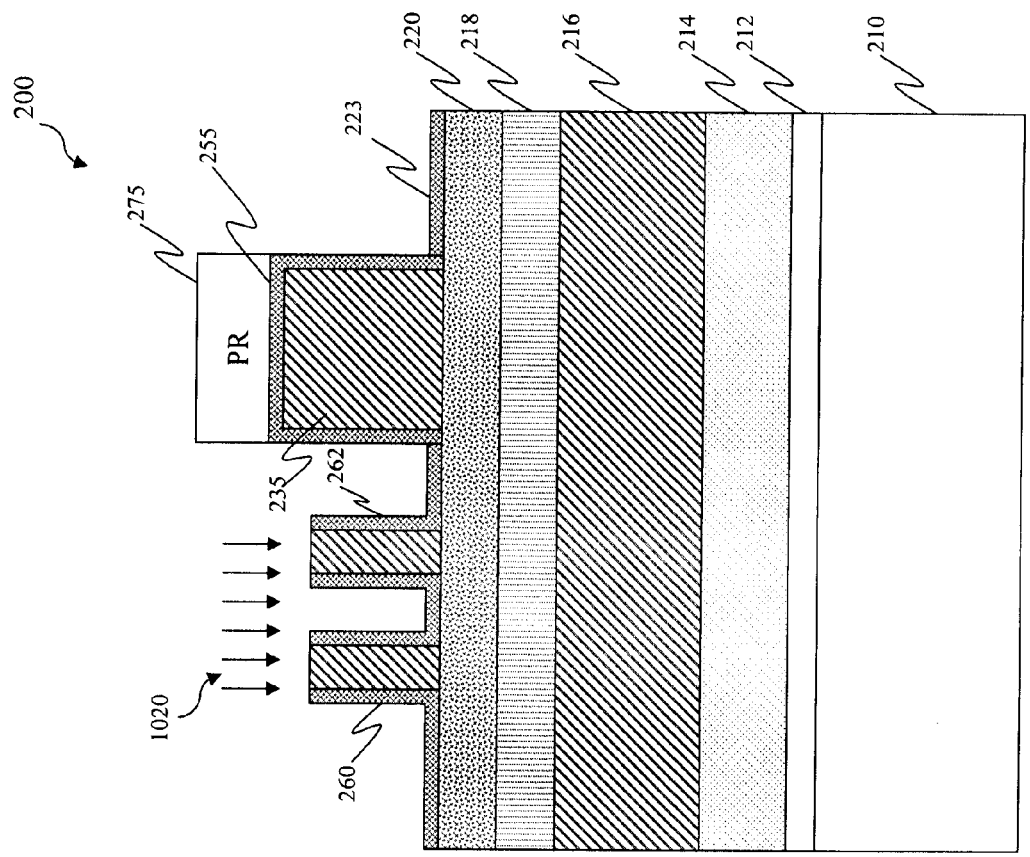
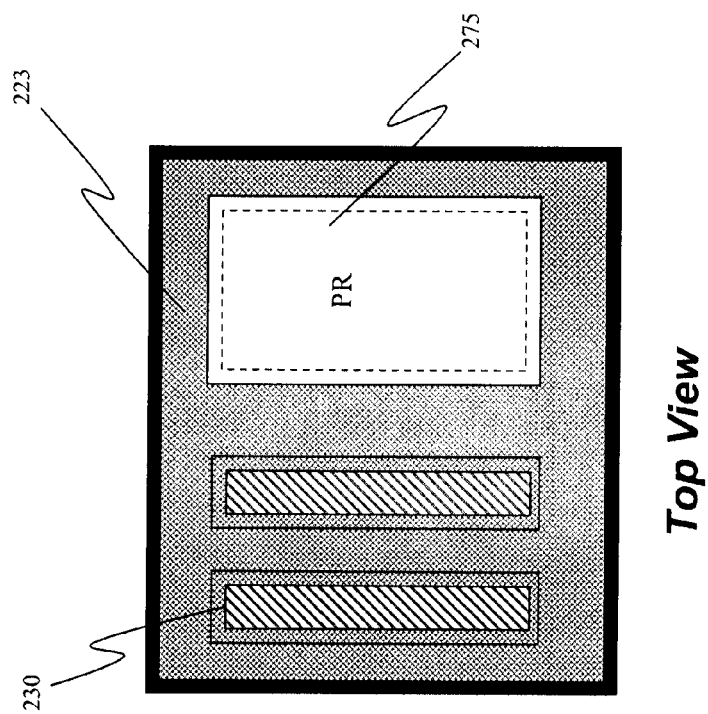
Fig. 10

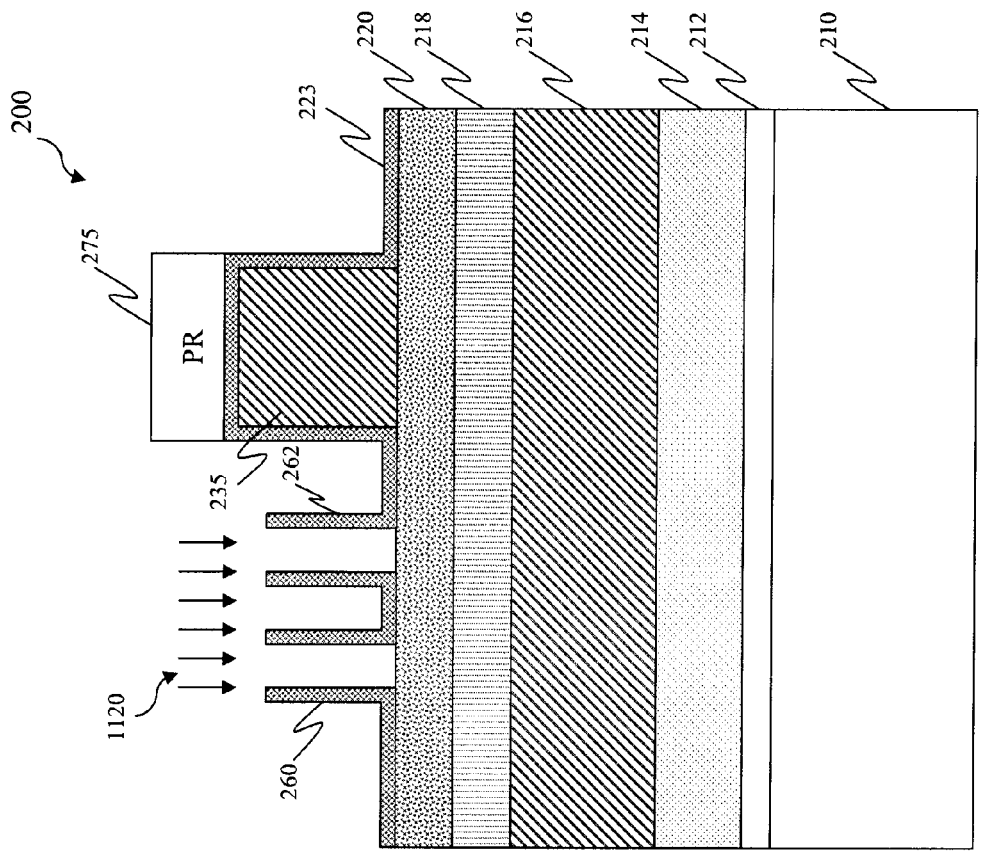
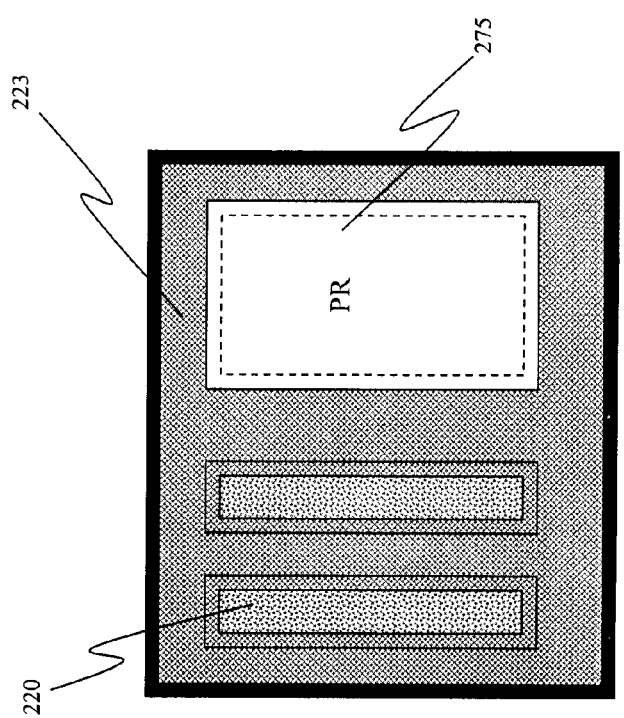
Fig. 11

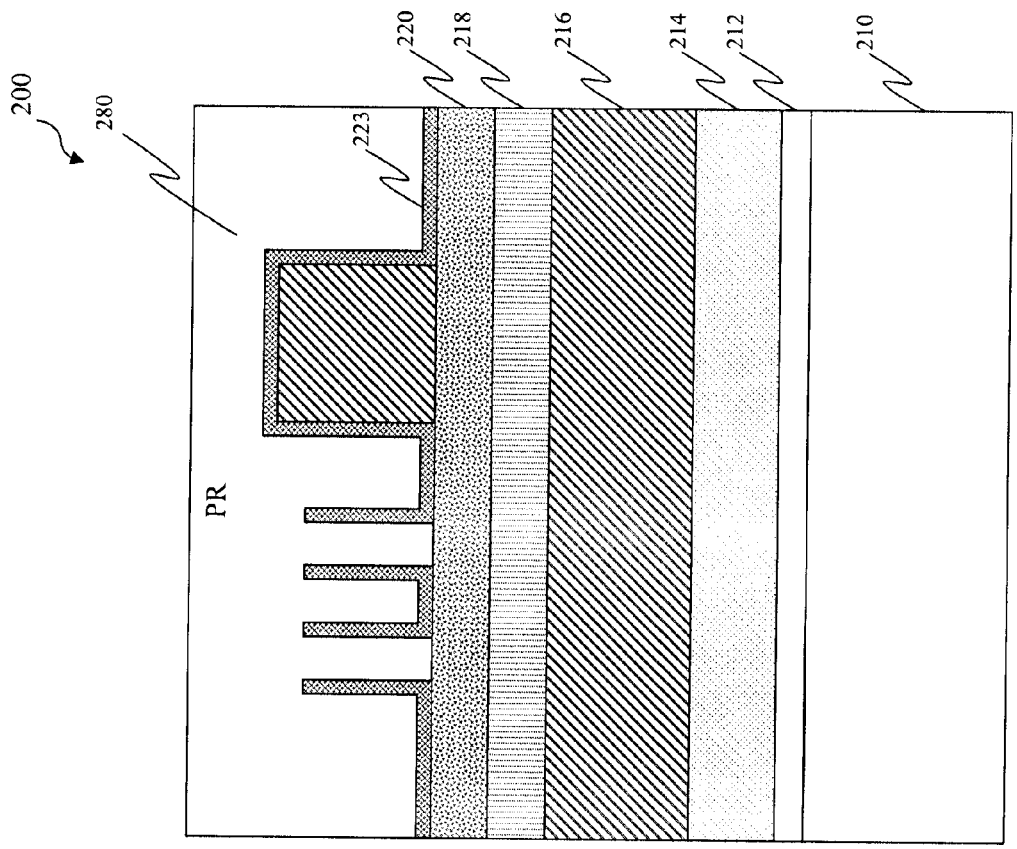
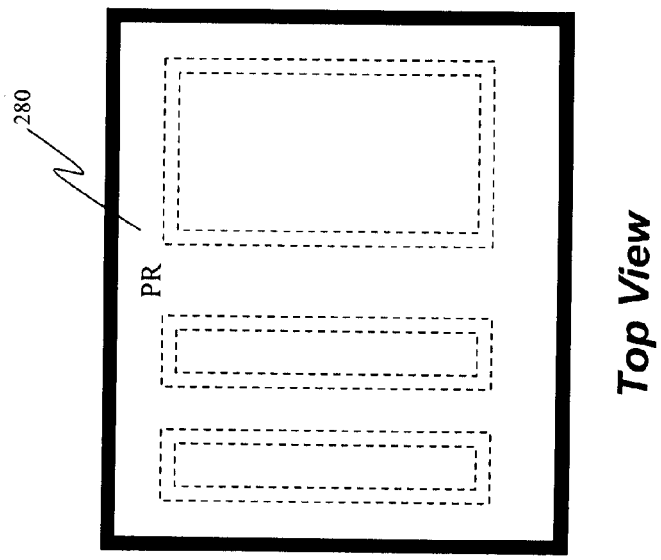
Fig. 12

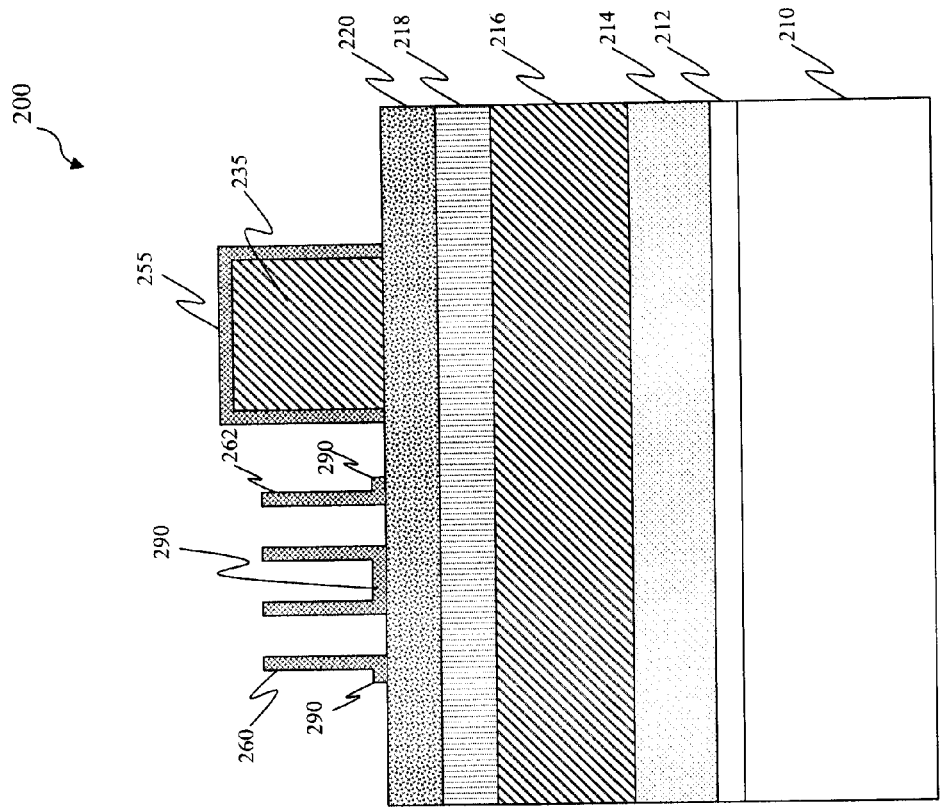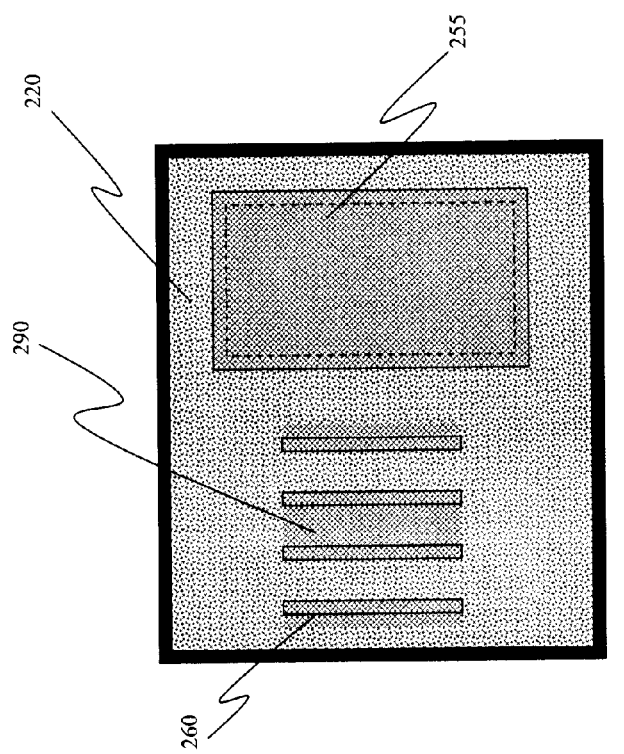
Fig. 15

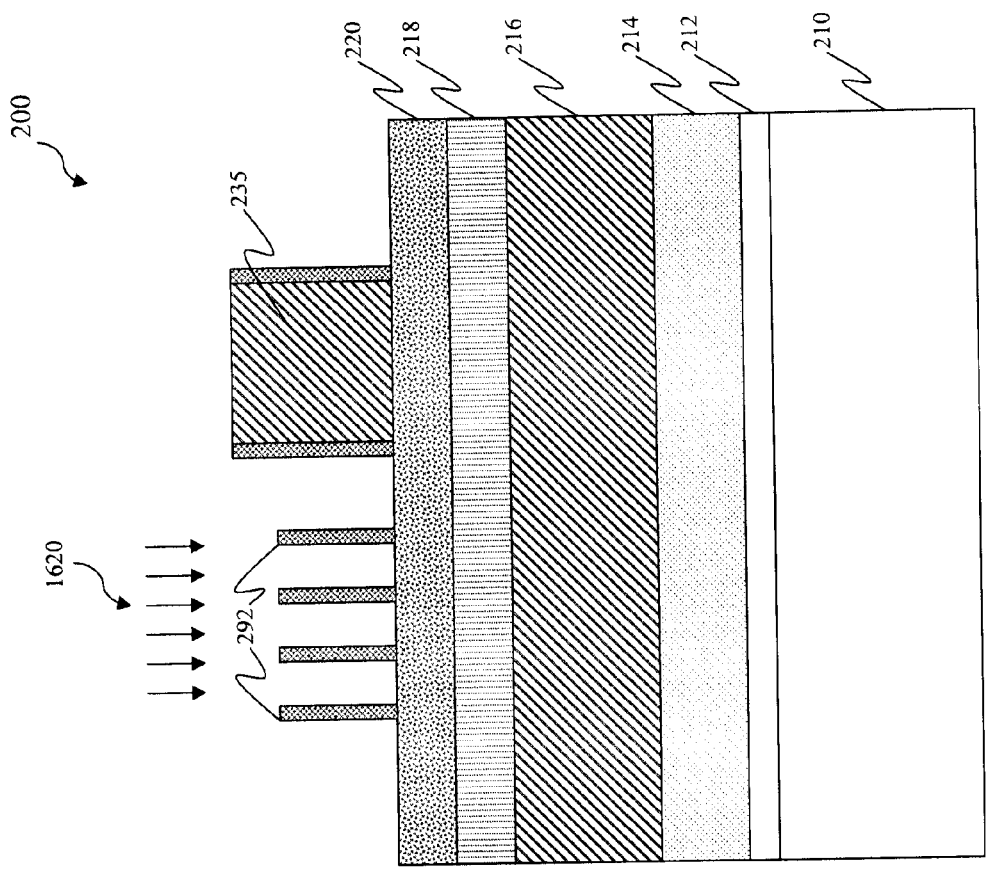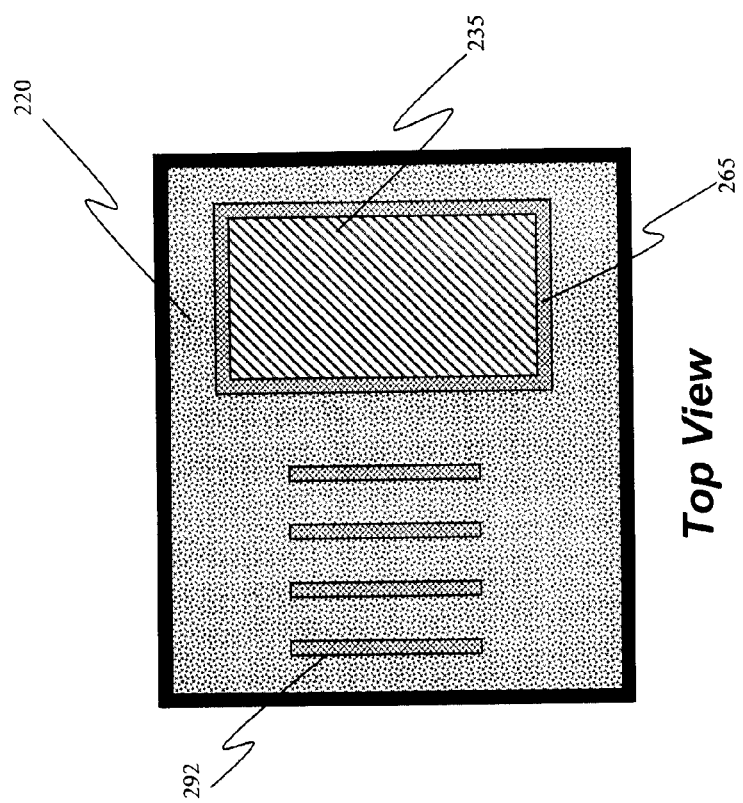
Fig. 16

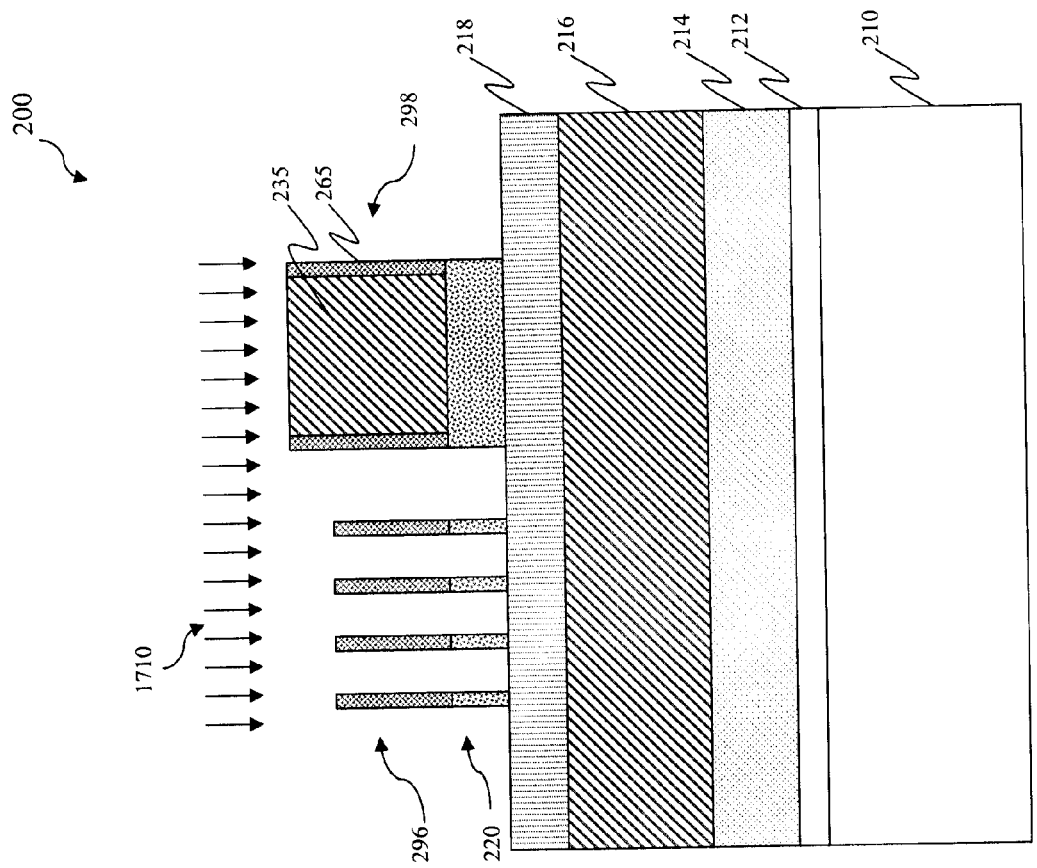
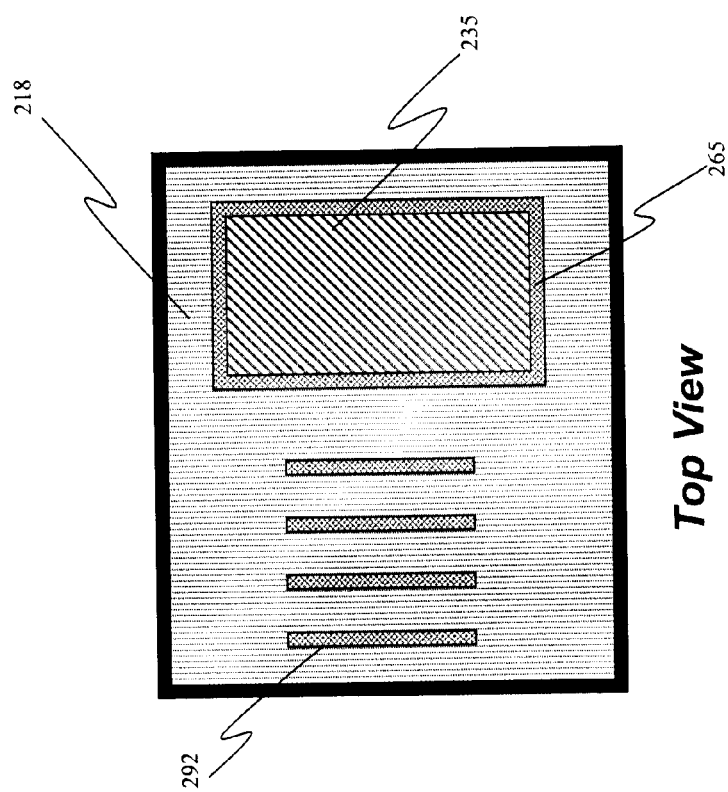
Fig. 17

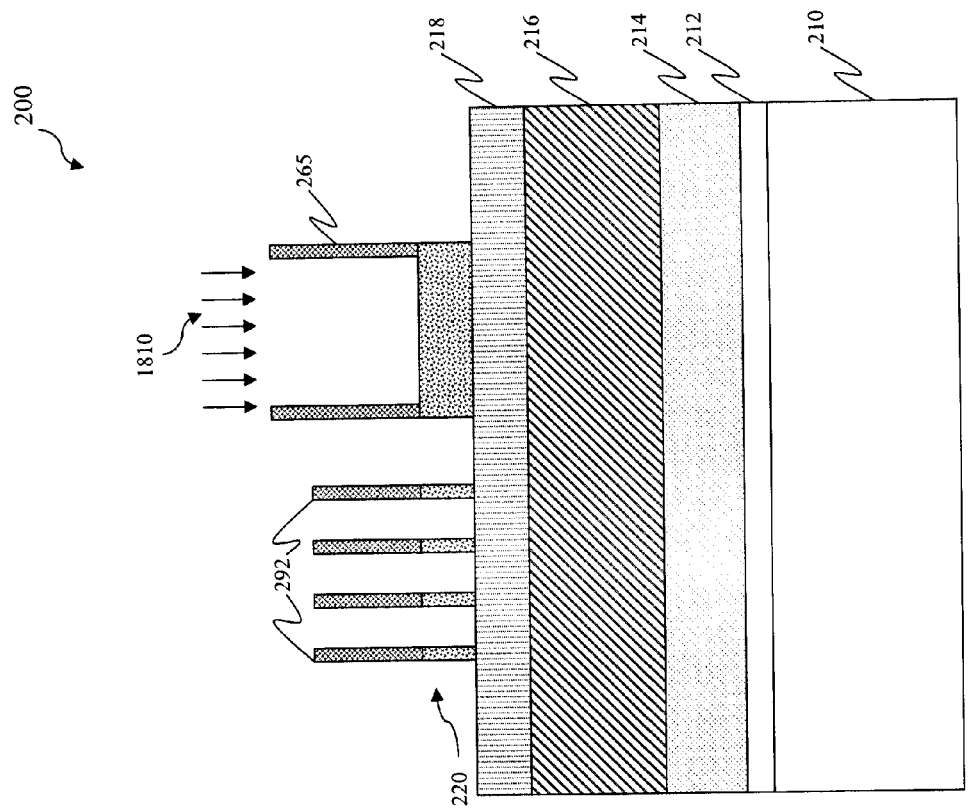
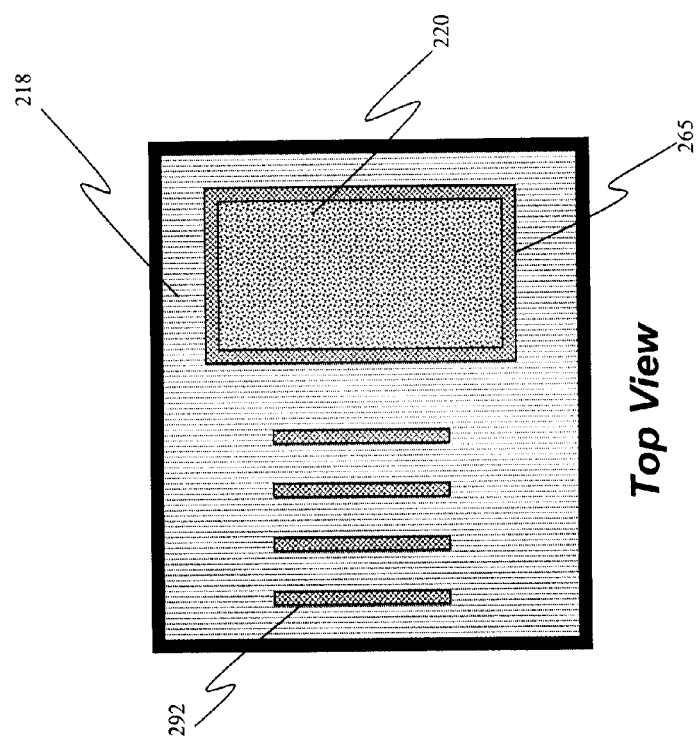
Fig. 18

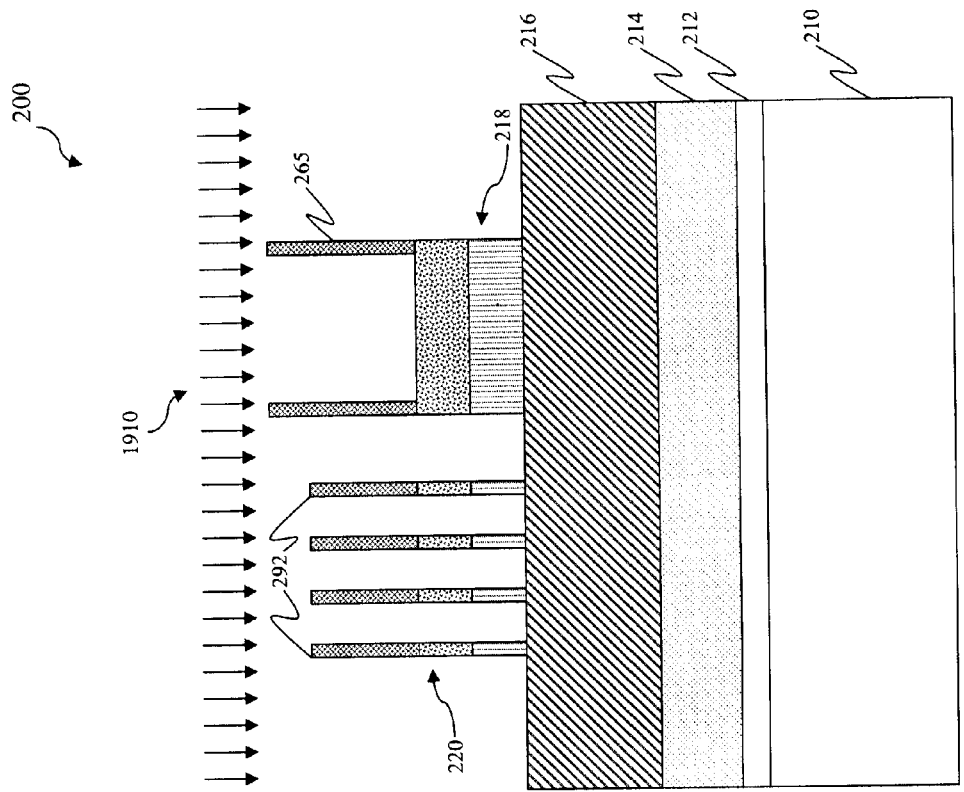
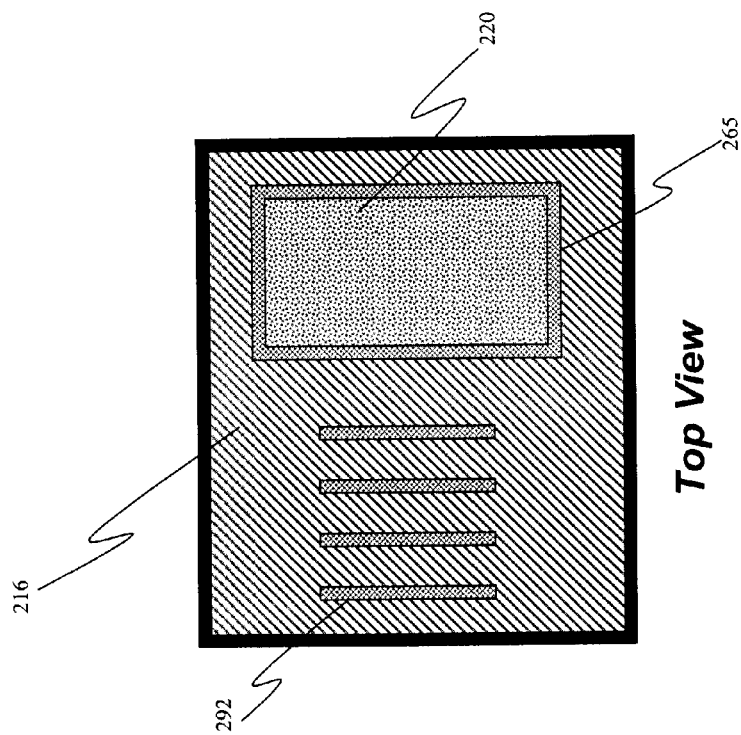
Fig. 19

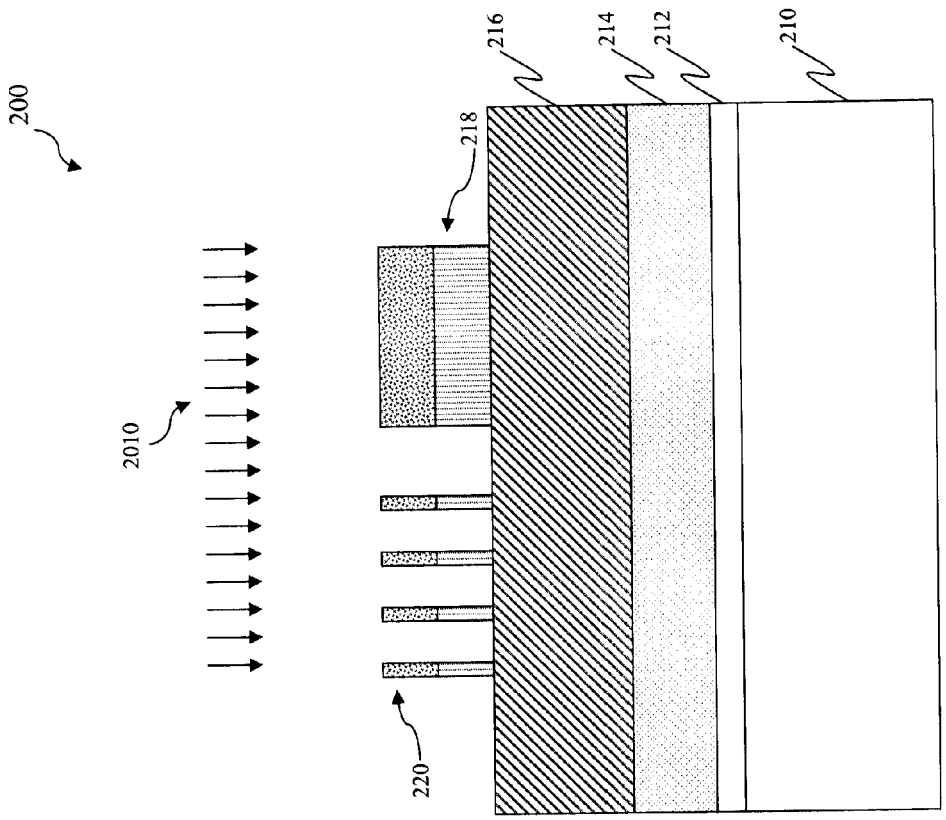
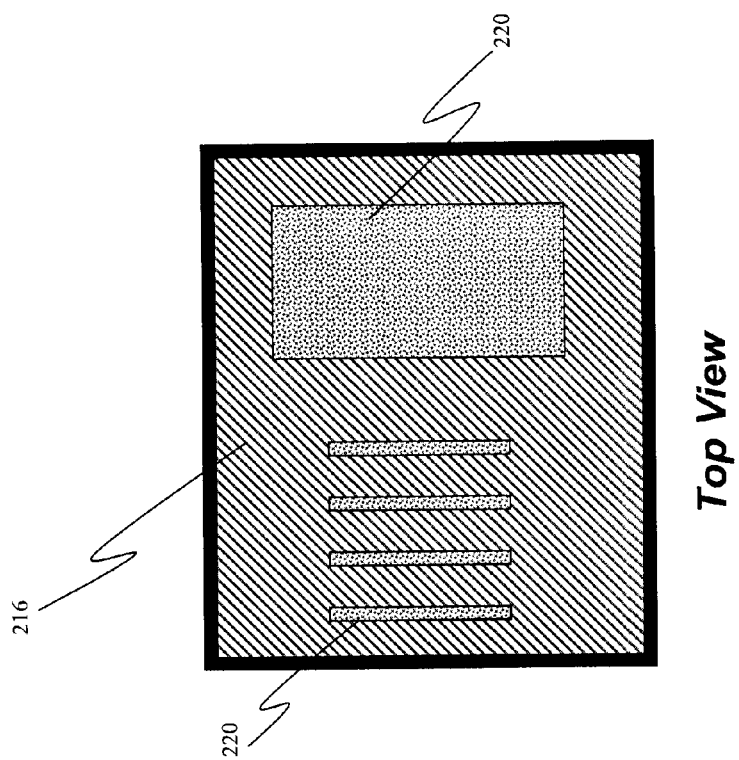
Fig. 20

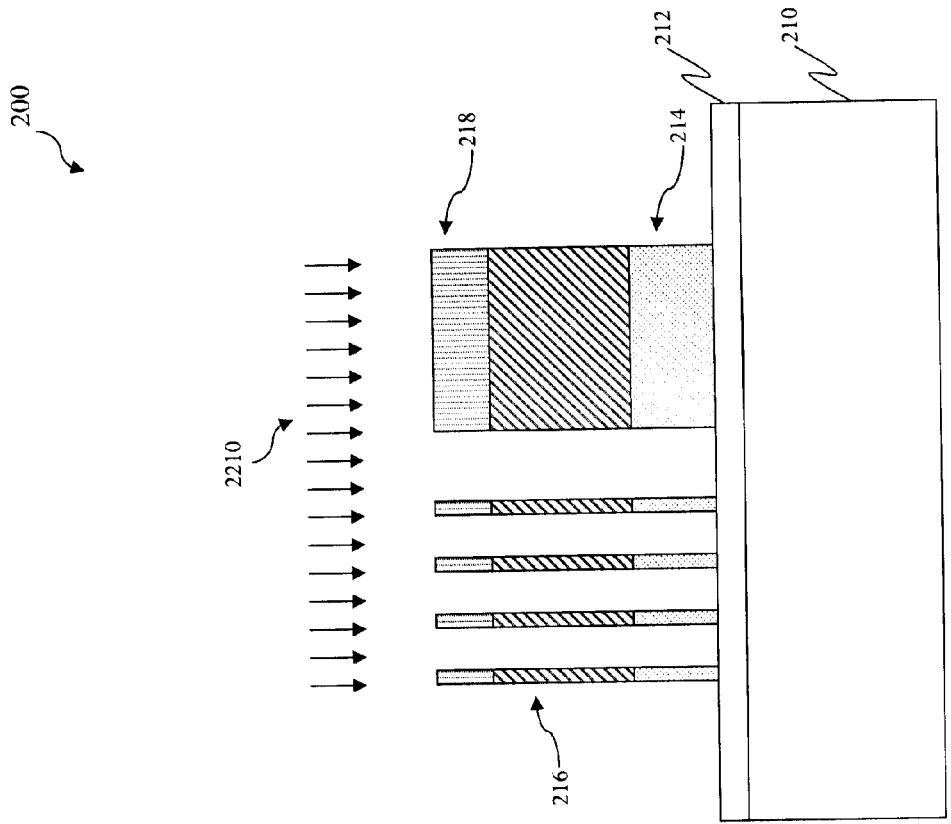
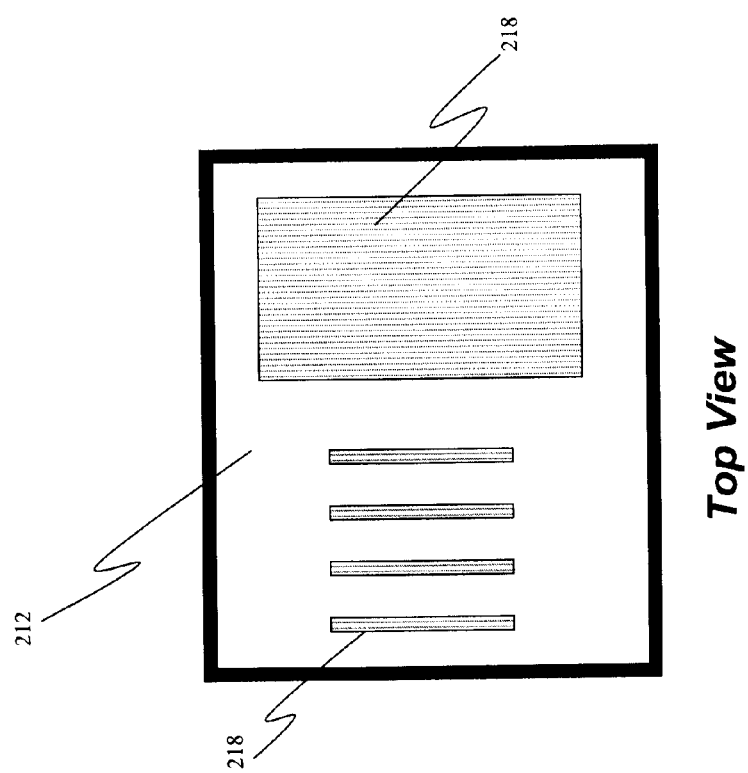
Fig. 22

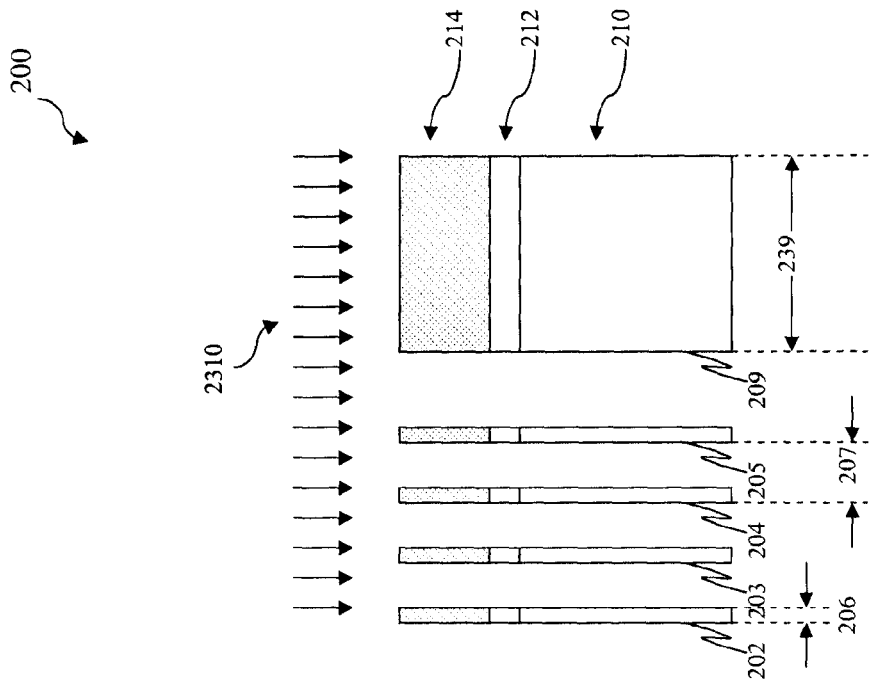
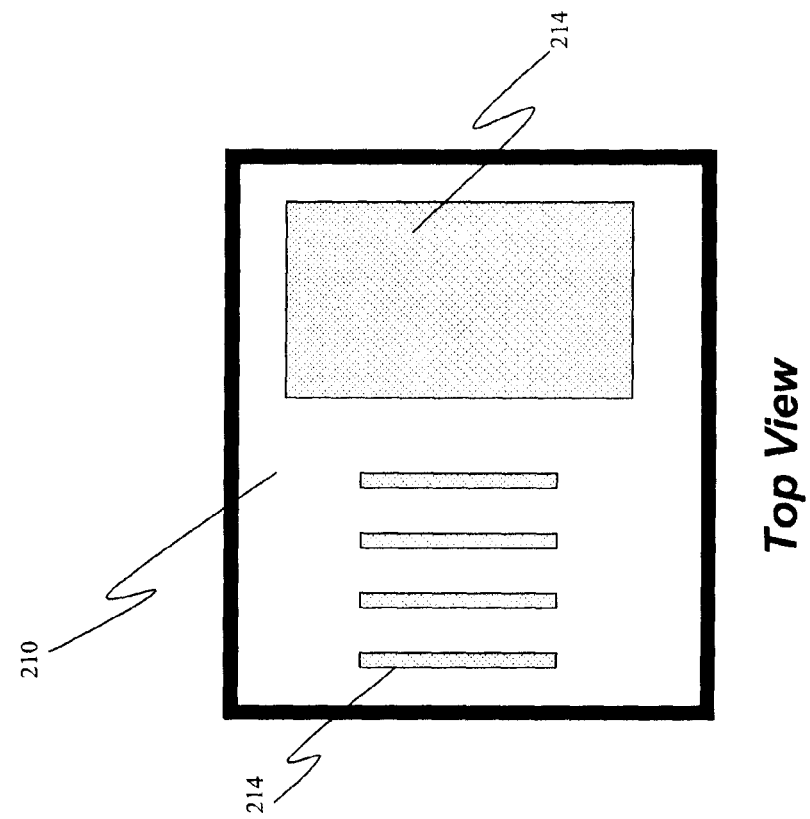
Fig. 23

METHOD OF PITCH HALVING

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

However, problems may arise as semiconductor technologies are continually progressing to smaller feature sizes, wherein "feature size" is a smallest size of a semiconductor feature that can be created by a particular photolithographic technology—meaning the smallest feature that can be etched onto the surface of a substrate by a fab facility's equipment—and still have the semiconductor feature function properly. For example, a feature could be a wire, a gate, or some other circuit component. When feature sizes shrink, the spacing between the features—or the pitch—shrinks as well. If the pitch gets small enough, a photolithography technology may have difficulties in forming a well defined pitch. Accordingly, a method to reduce the pitch without changing the photolithography technology is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 and FIGS. 4 to 23 include cross-sectional views and top views of a semiconductor device at various stages of fabrication according to the method of FIG. 1.

DETAILED DESCRIPTION

Figure 1:
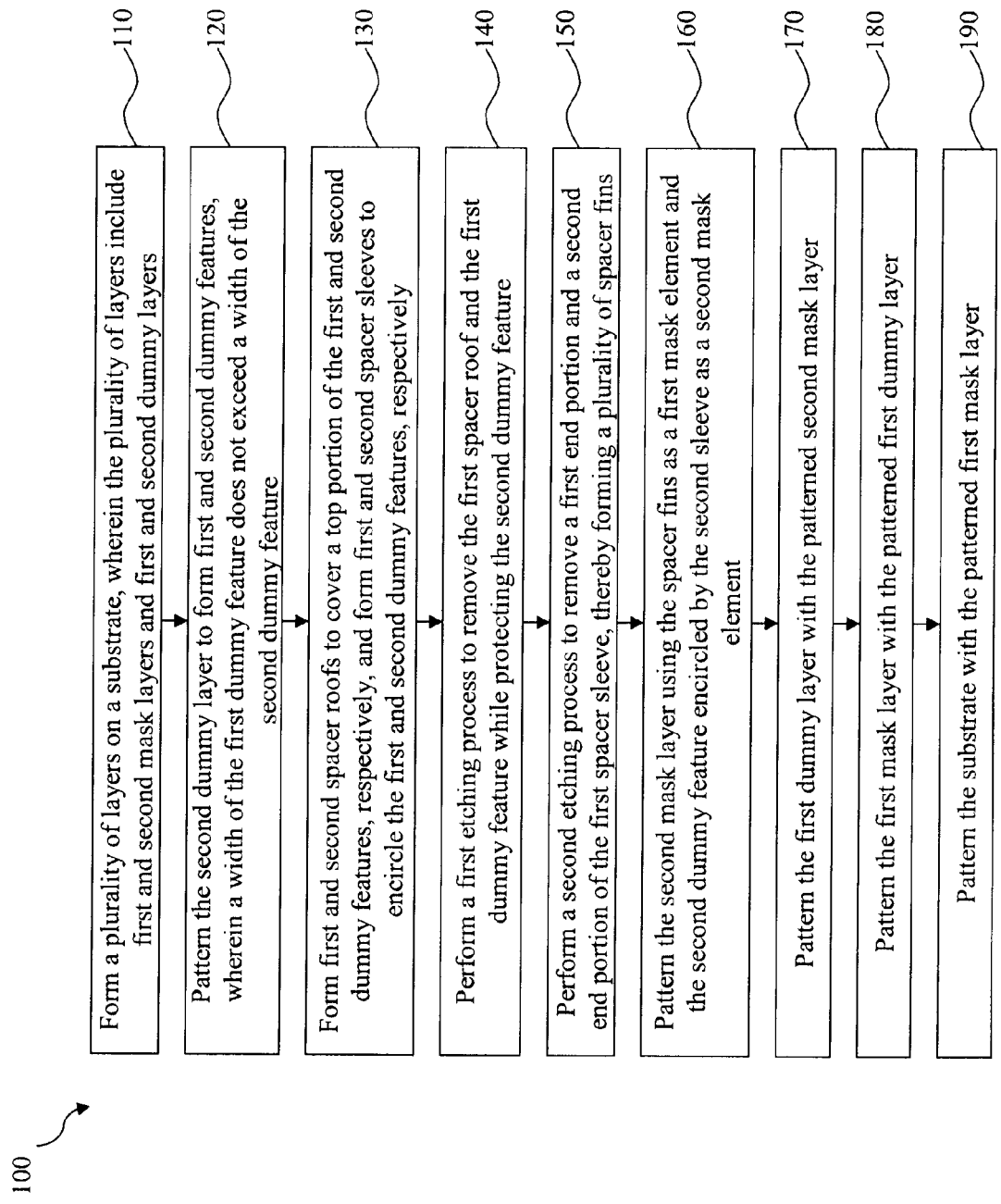
FIG. 1 is a flow chart illustrating a method for fabricating a semiconductor device to reduce a pitch according to various aspects of the present disclosure.
Figure 3:
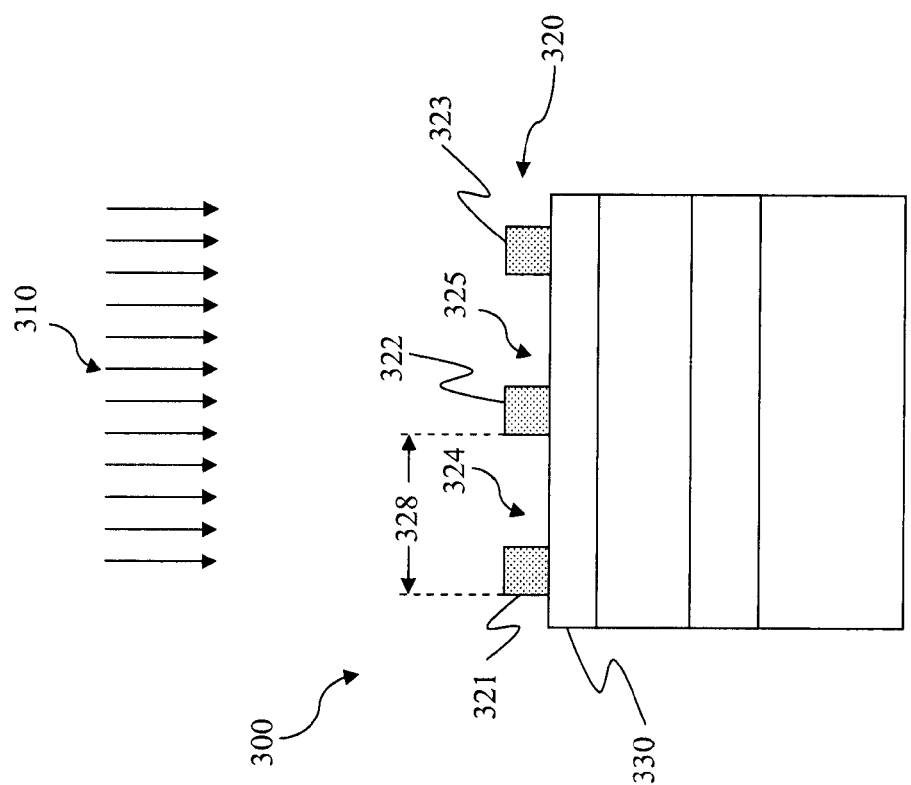
FIG. 3 include a cross sectional view of an exemplary photolithography process using a positive photoresist.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of one embodiment of a pitch halving method 100. FIGS. 2-23 are cross-sectional views and top views showing one embodiment of an integrated circuit device (semiconductor device) 200 during various fabrication stages. With reference to FIGS. 1-23, the method 100 for pitch halving is described.

Referring to FIG. 1, the method 100 begins with block 110 in which a plurality of layers are formed on a substrate, wherein the plurality of layers include first and second mask layers and first and second dummy layers. Referring now to FIG. 2, a substrate 210 may be a semiconductor wafer. For example, the substrate 210 may include silicon. The substrate 210 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Alternatively, the substrate 210 may include a non-semiconductor material such as a glass substrate for thin-film-transistor liquid crystal display (TFT-LCD) devices, or fused quartz or calcium fluoride for a photomask (mask). The substrate 210 may include various doped regions, dielectric features, and multilevel interconnects. In one embodiment, the substrate 210 includes various doped features for various microelectronic components, such as a complementary metal-oxide-semiconductor field-effect transistor (CMOSFET), imaging sensor, memory cell, and/or capacitive element. In another embodiment, the substrate 210 includes conductive material features and dielectric material features configured for coupling and isolating various microelectronic components, respectively.

Still referring to FIG. 2, a cushion layer 212 is formed on the substrate 210. The cushion layer 212 may be used to relieve stress that may result when a silicon nitride layer comes into contact with a silicon layer. In the present embodiment, the cushion layer 212 includes silicon oxide and includes a thickness ranging from about 1 nm to about 30 nm. A mask layer 214 may then be formed over the cushion layer 212. The mask layer 214 may include silicon nitride (SiN), silicon oxynitride (SiON), or other suitable material film formed by a suitable process, such as chemical vapor deposition (CVD). As an example, the precursor used to form a silicon nitride material layer in CVD includes Hexachlorodisilane (HCD) $Si_2Cl_6$; Dichlorosilane (DCS) $SiH_2Cl_2$; Bis(TertiaryButylAmino)Silane (BTBAS) $C_8H_{22}N_2Si$; and Disilane (DS) $Si_2H_6$. The mask layer 214 may function as a hard mask during a later etching process for patterning the substrate 210. In the present embodiment, the mask layer 214 includes SiN and includes a thickness ranging from about 10 nm to about 100 nm.

Still referring to FIG. 2, a dummy layer 216 may be formed over the mask layer 214. The dummy layer 216 may include a polymer or an amorphous carbon film. In the present embodiment, the dummy layer 216 includes an amorphous carbon film and includes a thickness ranging from about 50 nm to about 300 nm, preferably around 140 nm.

Still referring to FIG. 2, one or more mask layers 218-220 may then be formed over the dummy layer 216. In the present embodiment, a mask layer 218 is formed over the dummy layer 216. The mask layer 218 includes an oxide material and includes a thickness ranging from about 1 nm to about 30 nm, preferably around 30 nm. Another mask layer 220 may optionally be formed over the mask layer 218. In the present embodiment, the mask layer 220 includes SiON and includes a thickness ranging from about 1 nm to about 30 nm, preferably around 20 nm.

The method 100 continues with block 120 in which the second dummy layer is patterned to form first and second dummy features, wherein a width of the first dummy feature does not exceed a width of the second dummy feature. Still referring to FIG. 2, a dummy layer 222 may be formed over the mask layer 220. The dummy layer 222 may include a polymer or an amorphous carbon film. In the present embodiment, the dummy layer 222 includes an amorphous carbon film and includes a thickness ranging from about 50 nm to about 150 nm, preferably around 140 nm.

Still referring to FIG. 2, another mask layer 224 may be formed over the dummy layer 222. In the present embodiment, the mask layer 224 includes SiON and includes a thickness ranging from about 10 nm to about 30 nm, preferably around 20 nm. Additionally, a reflection-reduction layer 226 may be formed over the mask layer 224 to reduce reflection during lithography exposing processes. The reflection-reduction layer 226 may also be referred to as an anti-reflective coating (ARC) layer or bottom anti-reflective coating (BARC) layer. In one example, the BARC layer may include organic BARC material formed by a spin-coating technique. In the present embodiment, the BARC layer 226 includes a thickness ranging from about 1 nm to about 100 nm. In some other embodiments, the BARC layer 226 may be eliminated so that the mask layer 224 may function as a mask and an ARC layer.

Still referring to FIG. 2, a positive photoresist (positive resist) layer 228 may be formed over the BARC layer 226. The positive resist is characterized as photoresist in which regions that are exposed by an ultra-violet light during a photolithography process will be removed. As an illustration of the formation, refer to FIG. 3, where a positive resist layer is formed over a layer 330 on a semiconductor device 300. The positive resist layer is then patterned by a lithography process 310 to form a positive resist pattern 320. The positive resist pattern 320 includes a plurality of positive resist features 321-323 and a plurality of openings 324-325 defined by the positive resist features 321-323, such that portions of the layer 330 are exposed by the openings 324-325. The lithography process 310 uses a lithography system and a photomask. The openings 324-325 of the positive resist pattern 320 are formed according to a predetermined pattern in the photomask. In one embodiment, the positive resist pattern 320 includes a pitch 328, defined as the sum of a width of feature 321 and the distance between adjacent features 321 and 322. The size of the pitch 328 may vary depending on the photolithography technology used. One of the goals of the present embodiment is to further reduce the size of the smallest pitch possible for a given photolithography technology. The lithography process 310 used to form the positive resist pattern 320 may include resist coating, exposing, post-exposure baking, and developing. The exposing process may be carried out by exposing the semiconductor device 300 under a radiation beam through the mask. In another embodiment, the lithography process 310 may additionally include soft baking, mask aligning, and/or hard baking. Features 321-323 may then be used to pattern the layer 330 below. It is understood that in the present embodiment, the various photolithography processes used to pattern photoresist layers include the same or similar procedures to the photolithography process 310 described above.

Figure 4:
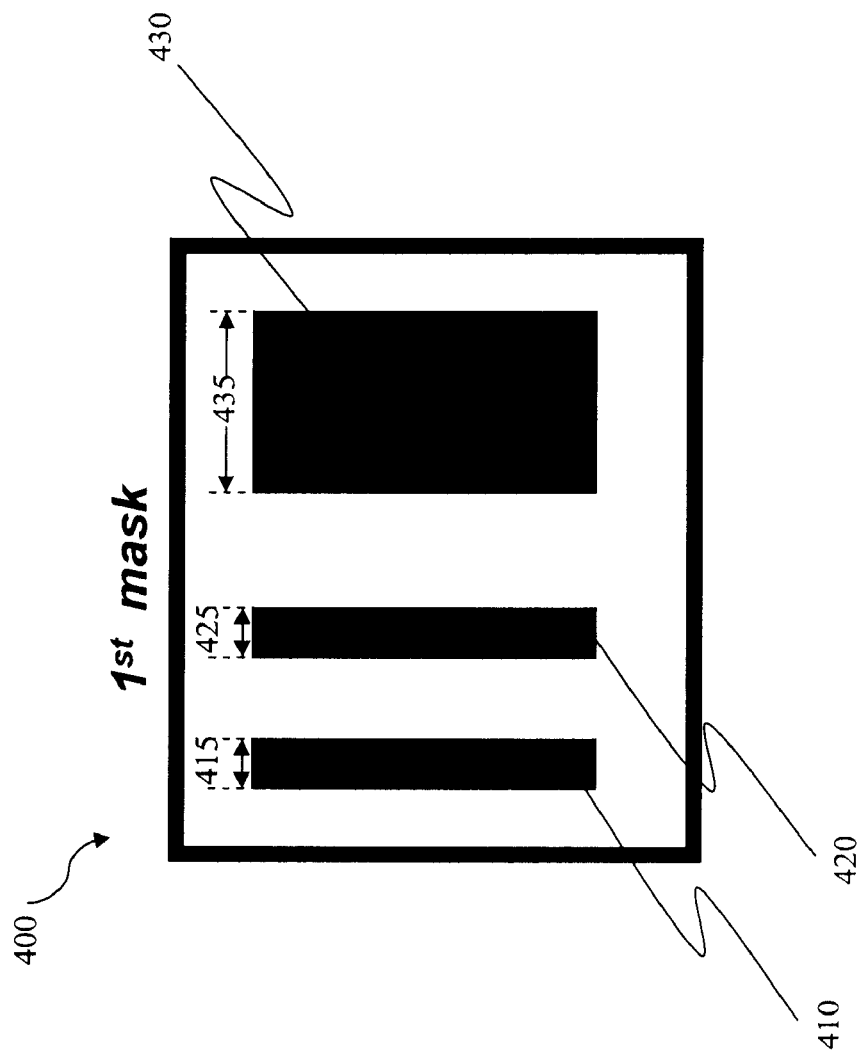

Coming back to the present embodiment, referring to FIG. 4, a photomask 400 is used to pattern the photoresist layer 228 shown in FIG. 2. The photomask 400 includes one or more opaque regions 410-430 impenetrable by light. These regions 410-430 help define the pattern of the photoresist layer 228. In the present embodiment, the opaque regions 410, 420, and 430 each has an associated width 415, 425, and 435, respectively, as is shown in FIG. 4. Also in the present embodiment, the width 415 may be substantially equal to width 425, and neither width 415 nor width 425 exceeds width 435. Opaque regions 410 and 420 may be used to form semiconductor features having small desired dimensions. In one embodiment, regions 410 and 420 may be used to form finFETs. In another embodiment, regions 410 and 420 may be used to form shallow trench isolation (STI) structures. Opaque region 430 may be used to form a semiconductor feature having larger desired dimensions compared to dimensions of features formed by regions 410 and 420. In the present embodiment, region 430 may be used to form an alignment mark, wherein the alignment mark is used to align multiple photomasks in various photolithography processes. In another embodiment, region 430 may be used to form input and output logic devices.

Figure 5:
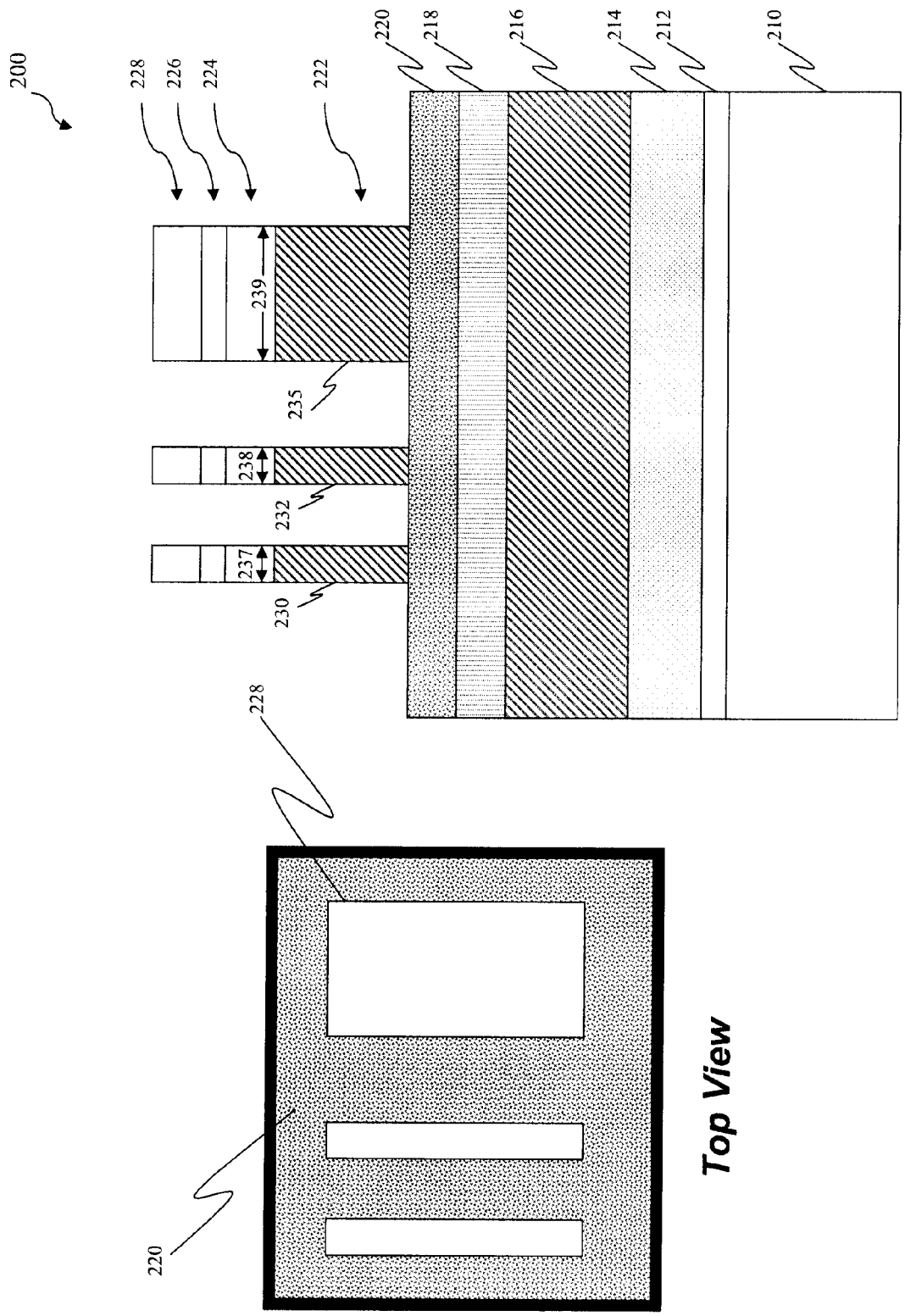

Referring now to FIGS. 4 and 5, the photomask 400 is used to pattern the photoresist layer 228 through a lithography process similar to the lithography process 310 described above. During the lithography process, the photomask 400 may be placed above the photoresist layer 228, and an ultra-violet light may be projected through the mask, exposing portions of the photoresist layer 228 below the photomask 400. Regions of photoresist layer 228 that are exposed to the light are then dissolved, which then exposes portions of the layer 226 below. Thereafter, the exposed portions of layers 226 and 224 are etched away, eventually transferring the pattern of the photomask 400 onto the mask layer 224. Mask layer 224 may then be used to pattern the dummy layer 222 to form a plurality of dummy features 230, 232, and 235.

Referring now to FIG. 6, dummy features 230, 232, and 235 remain after layers 224-228 are removed by various etching processes. As disclosed previously, the present embodiment employs the photomask 400 with regions 410 and 420 having widths 415 and 425 not exceeding the width 435 of region 430, and the pattern of the photomask 400 is transferred onto the dummy layer 222 to form dummy features 230, 232, and 235. As shown in FIG. 6, the dummy feature 235 includes a width 239, and the dummy features 230 and 232 include widths 237 and 238, respectively, wherein widths 237 and 238 do not exceed the width 239, and wherein widths 237, 238, 239 may be proportional to the widths 415, 425, 435, respectively. In the present embodiment, a pitch 240 is defined as the sum of the width 237 of feature 230 and a distance between adjacent features 230 and 232. The size of the pitch 240 may be limited by the photolithography technology used, for example the lens of the photolithography system or the wavelength of the projection light. The pitch 240 may represent a smallest pitch that can be formed under a photolithography technology that can meet design requirements. For example, in the present embodiment, the pitch 240 is about 90 nm, and the width of the features 230 and 232 is about 22.5 nm.

The method 100 continues with block 130 in which first and second spacer roofs are formed to cover a top portion of the first and second dummy features, respectively, and first and second spacer sleeves are formed to encircle the first and second dummy features, respectively. Referring now to FIG. 7, a spacer layer 223 is formed over the dummy features 230, 232, and 235 as well as the mask layer 220. The spacer layer 223 may include silicon nitride or silicon oxide, and it may be deposited by an atomic layer deposition (ALD) process or a chemical vapor deposition process (CVD) that is operable to control the thickness of the spacer layer formed. In the present embodiment, the spacer layer 223 includes a thickness 245 that is desired to be about ¼ of the pitch 240.

Still referring to FIG. 7, each of the dummy features 230, 232, and 235 is covered by the spacer layer 223, wherein portions of the spacer layer 223 covering a top portion of the dummy features 230, 232, and 235 may be referred to as "spacer roofs" 250, 252, and 255, respectively. Also, portions of the spacer layer 223 that encircle each of the dummy features 230, 232, and 235 may be referred to as "spacer sleeves" 260, 262, and 265, respectively.

The method 100 continues with block 140 in which a first etching process is performed to remove the first spacer roof and the first dummy feature while protecting the second dummy feature. Referring now to FIG. 8, a positive photoresist layer 270 is formed over the spacer layer 223. The photoresist layer 270 may then be patterned via a photomask 900A shown in FIG. 9A. In the present embodiment, the photomask 900A includes an opaque region 930 having dimensions larger than the dimensions of the opaque region 430 of the photomask 400, such that a photoresist mask patterned by the photomask 900A is sufficiently large to protect the dummy feature 235 as well as the spacer sleeve 265 that encircles the dummy feature 235. In an alternative embodiment, the opaque region 930 may have dimensions that are substantially the same as the dimensions of the opaque region 430 of the photomask 400.

Figure 9A:
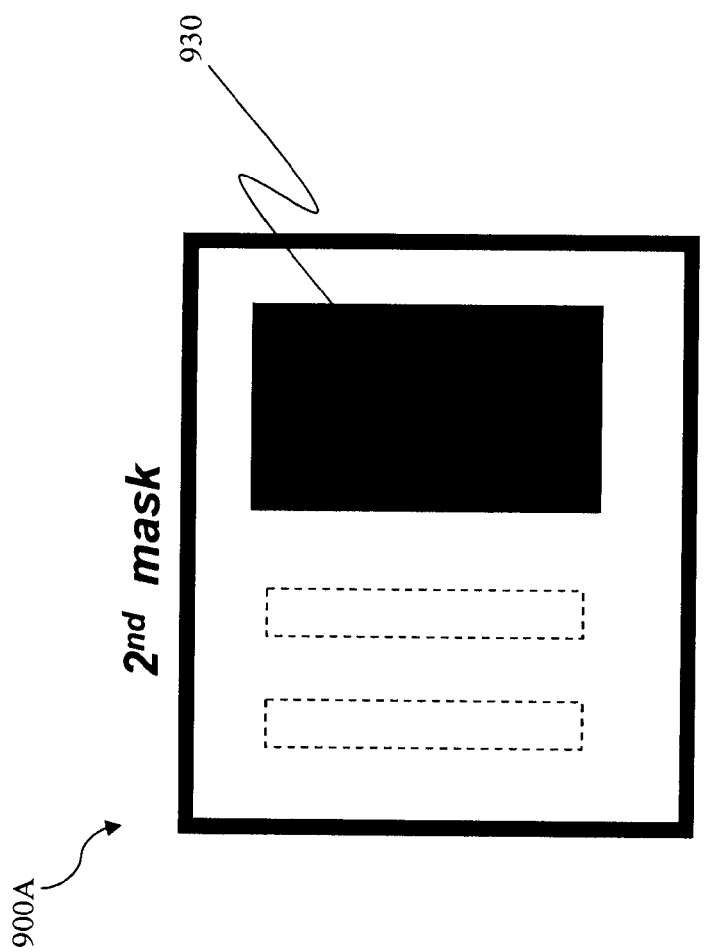
Figure 9B:
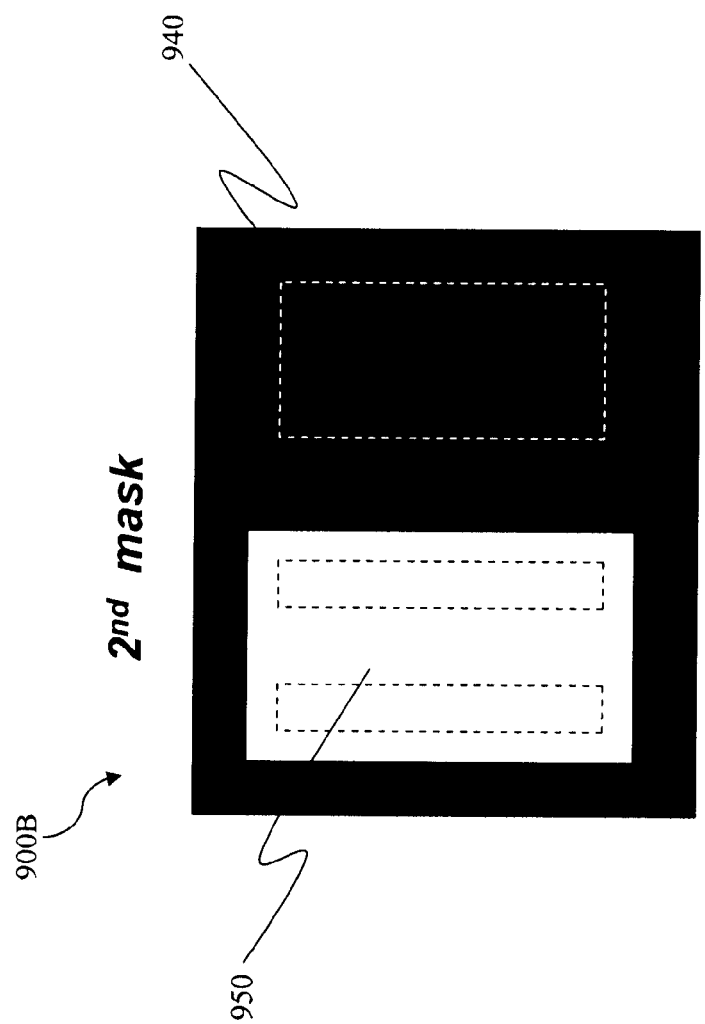

Yet another alternative embodiment of a photomask 900B is shown in FIG. 9B, where the photomask 900B includes an opaque region 940 as well as a transparent region 950. The transparent region 950 is large enough so that the dummy features 230 and 232 would be left unprotected by a photoresist mask patterned by the photomask 900B. Also note that the dashed lines shown within the photomask 900A-B in FIGS. 9A-9B serve to help the reader visualize the location of the dummy features 230, 232, 235 and do not represent a physical feature of the photomask 900A-B. In both embodiments of the photomask 900A-B shown in FIGS. 9A and 9B, the photomask 900A-B may align directly to the dummy feature 235 if used as an alignment mark.

Referring now to FIG. 10, a photolithography process may be performed to pattern the photoresist layer 270 to form a protective photoresist mask 275. The photoresist mask 275 protects the spacer roof 255 covering the top portion of dummy feature 235 from being etched in the later etching processes. The rest of the photoresist layer 270 may then be removed. At this point, an etching process 1020 may be performed to etch away the spacer roofs 250 and 252 of the dummy features 230 and 232. The etching process 1020 may be a dry etching process to ensure that the spacer sleeves 260 and 262 remain substantially un-etched while the spacer roofs 250 and 252 are etched away.

Referring now to FIG. 11, an etching process 1120 may be performed to remove the dummy features 230 and 232. The etching process 1120 has sufficient etching selectivity such that the material of the dummy features 230 and 232 may be etched away while the spacer layer 223 and the mask layer 220 remain substantially un-etched. After the etching process 1120 is performed, the photoresist mask 275 is removed.

The method 100 continues with block 150 in which a second etching process is performed to remove a first end portion and a second end portion of the first spacer sleeve, thereby forming a plurality of spacer fins. Referring now to FIG. 12, a positive photoresist layer 280 is formed over the spacer layer 223 as well as regions of mask layer 220 that are uncovered by the spacer layer 223. The photoresist layer 280 may then be patterned via a photomask 1300A shown in FIG. 13A. In the present embodiment, the photomask 1300A includes an opaque region 1330 having dimensions that are substantially the same as the dimensions of the opaque region 930 of the photomask 900A shown in FIG. 9A. In other embodiments, the opaque region 1330 may have dimensions that are greater than the dimensions of the opaque region 930 of photomask 900A. Also in the present embodiment, the photomask 1300A includes an opaque region 1320 having dimensions large enough so that a middle portion 1310 of dummy features 230 and 232 would be protected by a photoresist mask patterned by the photomask 1300A, but that top end portions 1360 and 1370 as well as bottom end portions 1380 and 1390 of the spacer sleeves 260 and 262, respectively, would be left unprotected by the photoresist mask.

Figure 13A:
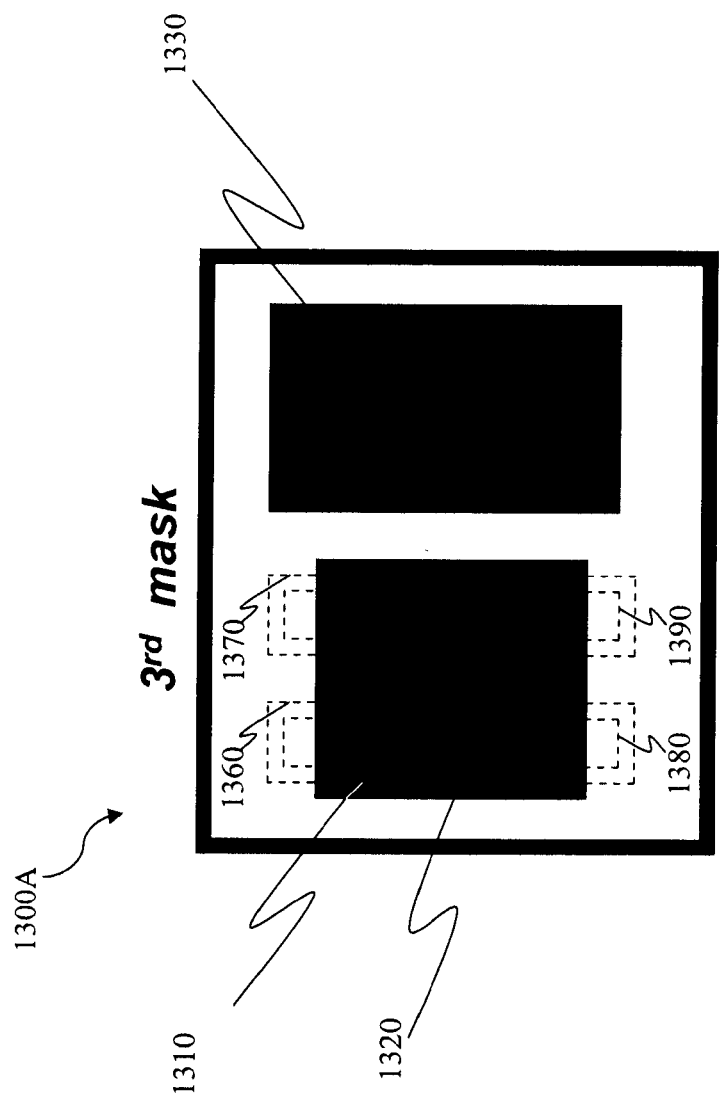
Figure 13B:
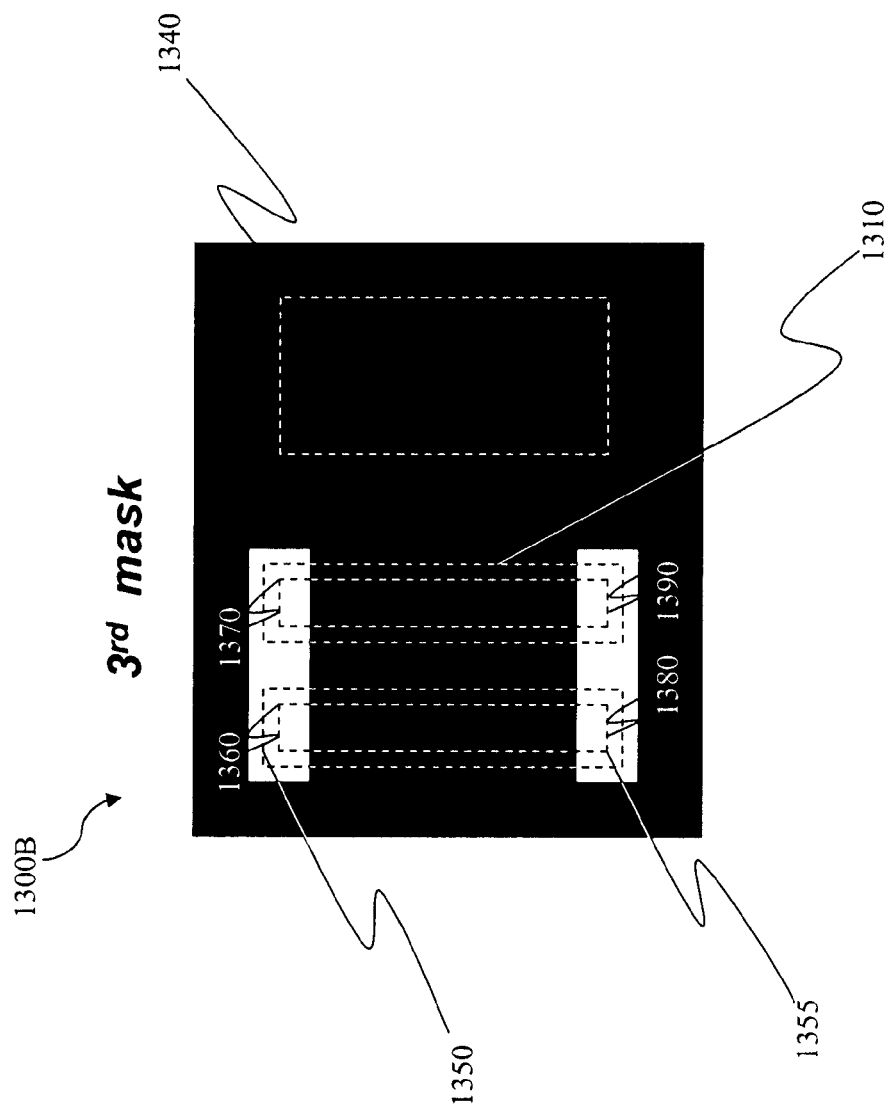

An alternative embodiment of photomask 1300B is shown in FIG. 13B, wherein the photomask 1300B includes an opaque region 1340 and transparent regions 1350 and 1355. In this alternative embodiment, the opaque region 1430 may be used to form a photoresist mask operable to protect the dummy feature 235 and the middle portion 1310 of spacer sleeves 260 and 262. The transparent regions 1350 and 1355 may be large enough so that the middle portion 1310 of spacer sleeves 260 and 262 would be protected but the photoresist mask patterned by the photomask 1300B, but that top end portions 1360 and 1370 as well as bottom end portions 1380 and 1390 of the spacer sleeves 260 and 262, respectively, would be left unprotected by the photoresist mask. Also note that the dashed lines shown within the photomask 1300A-B in FIGS. 13A-13B serve to help the reader visualize the locations of the dummy features 230, 232, 235 as well as the spacer sleeves 260, 262 and do not represent a physical feature of the photomask 1300A-B. In both embodiments of the photomask 1300A-B, the photomask 1300A-B may align directly to the dummy feature 235 if used as an alignment mark.

Figure 14:
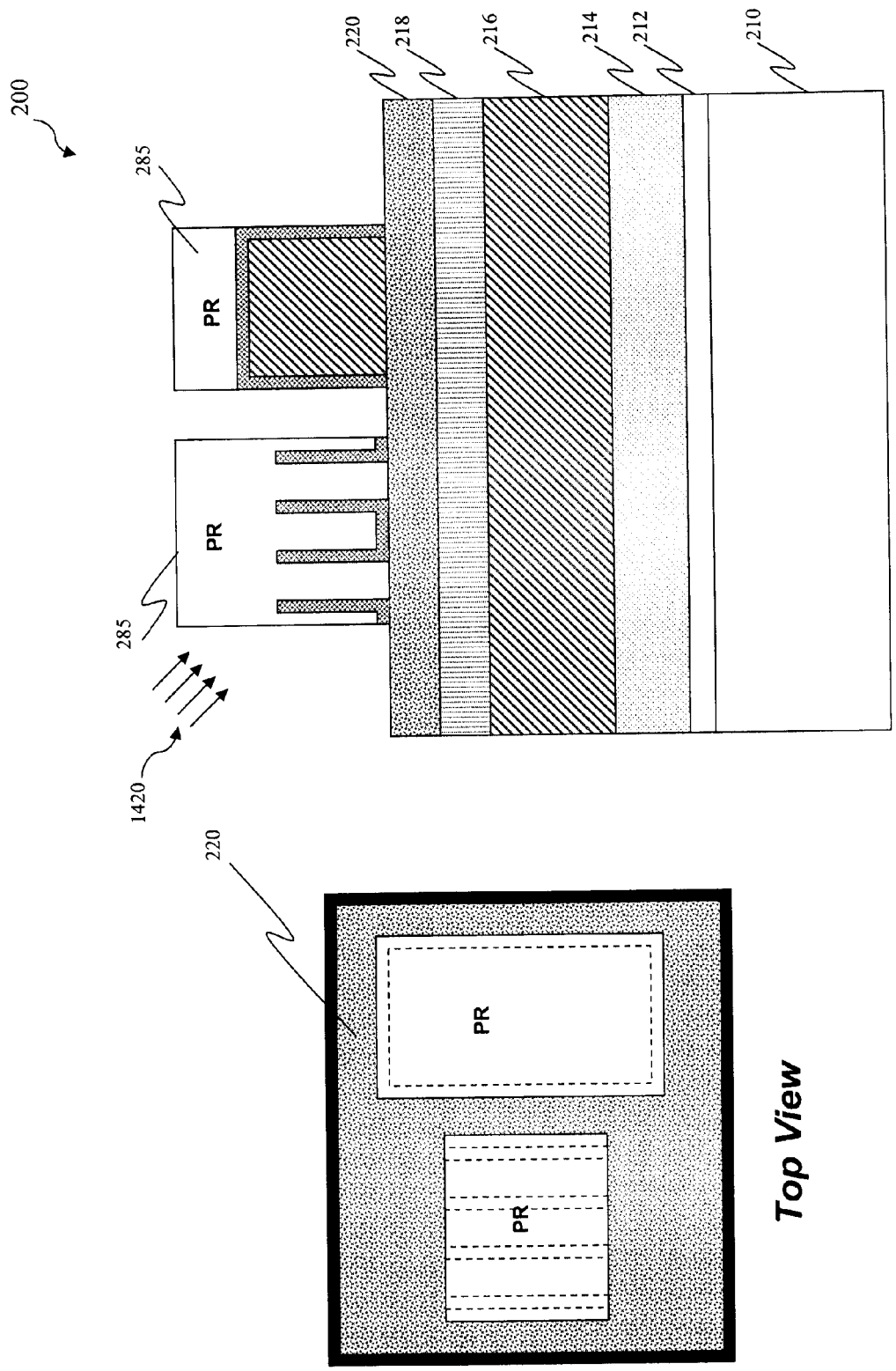

Referring to FIG. 14, the photoresist layer 280 is patterned by the photomask 1300A to form the photoresist mask 285 through a lithography process. The photoresist mask 285 does not cover the end portions 1360-1390 of the spacer sleeves 260 and 262. In an etching process 1420, unprotected end portions 1360-1390 are etched away, along with other portions of the spacer layer 223 that are unprotected by the photoresist mask 285. In the present embodiment, the etching process 1420 has sufficient selectivity such that the material in the spacer layer 223 is etched away while the mask layer 220 and the photoresist mask 285 remain substantially un-etched.

Referring now to FIG. 15, the photoresist mask 285 is removed after the etching process 1420 is performed. FIG. 15 also shows that some undesired spacer portions 290 of the spacer layer 223 may remain after the etching process 1420 is performed, since these undesired spacer portions 290 were protected by the photoresist mask 285 during the etching process 1420. The undesired spacer portions 290 will be removed later.

Referring now to FIG. 16, an etching process 1620 may be performed to etch away the spacer roof 255 of the dummy feature 235 as well as the undesired spacer portions 290. The etching process 1620 may be a dry etching process. A plurality of spacer fins 292 are thus formed as a result of the removal of the undesired spacer portions 290 and the removal of the spacer roofs 250 and 252 discussed previously.

The method 100 continues with block 160 in which the second mask layer is patterned using the spacer fins as a first mask element and the second dummy feature encircled by the second sleeve as a second mask element. Referring now to FIG. 17, in the present embodiment, the plurality of spacer fins 292 serve as a mask element 296, and the dummy feature 235 encircled by the spacer sleeve 265 serve as another mask element 298. In an alternative embodiment, the spacer sleeve 265 encircling the dummy feature 235 may be etched away, and the dummy feature 235 alone may serve as the mask element 298. The mask elements 296 and 298 protect portions of the mask layer 220 below during an etching process 1710, wherein unprotected portions of the mask layer 220 are etched away. Thus, the mask layer 220 is patterned with the mask elements 296 and 298, and the patterned mask layer 220 may be used to pattern the mask layer 218 below. Referring to FIG. 18, prior to the patterning of the mask layer 218, an etching process 1810 may be performed to remove the dummy feature 235 while the spacer sleeve 265 and the spacer fins 292 remain substantially un-etched.

Referring now to FIG. 19, the patterned mask layer 220 may be used to protect portions of the mask layer 218 below during an etching process 1910, wherein unprotected portions of the mask layer 218 are etched away. Thus, the mask layer 218 is patterned with the patterned mask layer 220. Refer now to FIG. 20, an etching process 2010 may be performed to etch away the spacer layer 223 still remaining, including the spacer fins 292 and the spacer sleeve 265. Note that although the etching process 2010 is performed after the etching process 1910 in the present embodiment, the etching process 2010 may be performed before the etching process 1910 in other embodiments.

Figure 21:
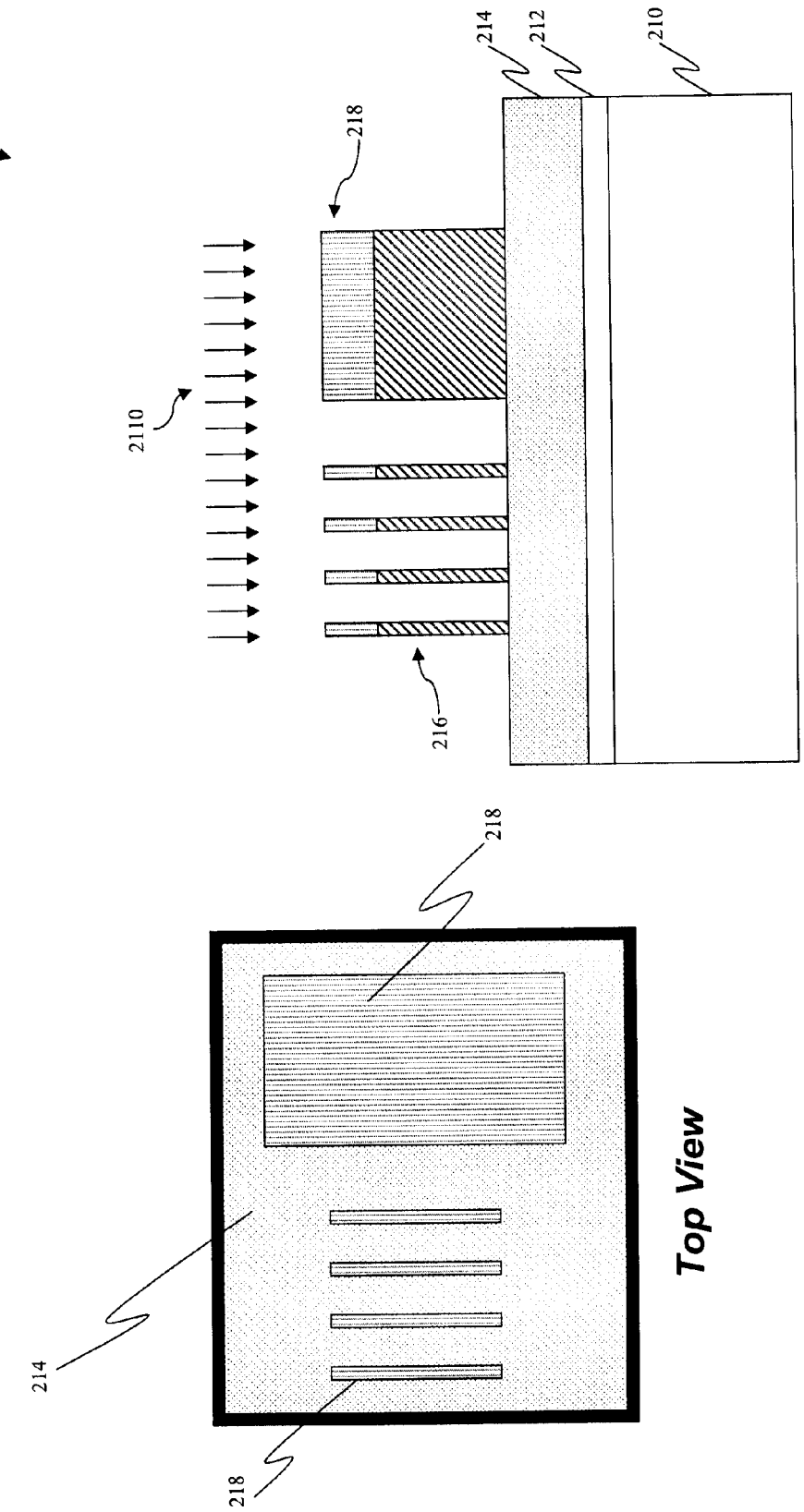

The method 100 continues with block 170 in which the first dummy layer is patterned with the patterned second mask layer. Referring now to FIG. 21, the patterned mask layer 218 may be used to protect portions of the dummy layer 216 below during an etching process 2110, wherein unprotected portions of the dummy layer 216 are etched away. Thus, the dummy layer 216 is patterned with the patterned mask layer 218.

The method 100 continues with block 180 in which the first mask layer is patterned with the patterned first dummy layer. Referring now to FIG. 22, the patterned dummy layer 216 may be used to protect portions of the mask layer 214 below during an etching process 2210, wherein unprotected portions of the mask layer 214 are etched away. Thus, the mask layer 214 is patterned with the patterned dummy layer 216.

The method 100 continues with block 190 in which the substrate is patterned with the patterned first mask layer. Referring now to FIG. 23, the patterned mask layer 214 may be used to protect portions of the cushion layer 212 below during an etching process 2310, wherein unprotected portions of the cushion layer 212 are etched away. Thus, the cushion layer 212 is patterned with the patterned mask layer 214. In the same way, the substrate is patterned with the patterned cushion layer 212. As a result, features 202-209 are formed. A pitch 207 is the sum of the width of the spacer fin 204 and the distance between adjacent spacer fins 204 and 205. It can be observed that the size of the pitch 207 is about half of the size of the pitch 240 shown in FIG. 6, wherein pitch 240 may represent the smallest possible pitch for a given photolithography technology. Thus, one advantage of the present embodiment is that the smallest possible pitch size for a given photolithography technology can be halved through various patterning processes and without having to change the photolithography technology. It can also be observed that the features 202-205 each has a width 206 that is half of the width 237 of the dummy feature 230. Thus, another advantage of the present embodiment is that the feature sizes may be reduced while the photolithography technology remains the same. Consequently, a semiconductor chip manufactured using this method may have a higher packing density. Furthermore, another advantage of the present embodiment is that the method 100 accomplishes the pitch-halving task while using only 3 photomasks (400, 900A, 1300A), while other methods may require 4 or more photomasks. Yet another advantage of the present embodiment is that features of varying sizes may be formed in the same process step using the same mask, while this may not be possible with other methods.

It is also noted that although positive photoresist is used in the present embodiment, negative photoresist may be used in other embodiments to perform the steps described above. Photomasks 400, 900A-B and 1300A-B would be adjusted for patterning the semiconductor device 200 with negative photoresist instead of positive photoresist. Specifically, the opaque regions and the transparent regions of each photomask would be switched.

In summary, the methods and devices disclosed provide a effective approach to reduce a pitch size for a given photolithography technology. The method disclosed herein takes advantage of multiple photomasks having different patterns and multiple etching processes to reduce the pitch size. Moreover, the methods disclosed herein implement materials and processes that are friendly and compatible with the CMOS process flow, and that are inexpensive to incorporate with the process flow. It is understood that different embodiments disclosed herein offer several different advantages, and that no particular advantage is necessarily required for all the embodiments.

Thus provided is a method of fabricating a semiconductor device that includes forming a mask layer over a semiconductor substrate, forming a dummy layer having a first dummy feature and a second dummy feature over the mask layer, wherein a width of the first dummy feature does not exceed a width of the second dummy feature, forming first and second spacer roofs to cover a top portion of the first and second dummy features, respectively, and forming first and second spacer sleeves to encircle side portions of the first and second dummy features, respectively, removing the first spacer roof and the first dummy feature while protecting the second dummy feature, removing a first end portion and a second end portion of the first spacer sleeve to form a plurality of spacer fins, and patterning the mask layer using the spacer fins as a first mask element and the second dummy feature as a second mask element.

Also provided is a method of fabricating a semiconductor device that includes forming a first mask layer over a semiconductor substrate, forming a first dummy layer over the first mask layer, forming a second mask layer over the first dummy layer, forming a second dummy layer having a first dummy feature and a second dummy feature over the second mask layer, wherein a width of the first dummy feature does not exceed a width of the second dummy feature, forming first and second spacer roofs to cover a top portion of the first and second dummy features, respectively, and forming first and second spacer sleeves to surround the first and second dummy features, respectively, performing a first etching process to remove the first spacer roof and the first dummy feature while protecting the second dummy feature and the second spacer sleeve, performing a second etching process to remove a first portion and a second portion of the first spacer sleeve while protecting a third portion of the first spacer sleeve, the second dummy feature, and the second spacer sleeve, thereby forming a plurality of spacer fins, wherein the third portion is disposed between the first and second portions, patterning the second mask layer using the third portion of the first spacer sleeve as a first mask element and the second dummy feature surrounded by the second spacer sleeve as a second mask element, patterning the first dummy layer with the patterned second mask layer, patterning the first mask layer with the patterned first dummy layer, and patterning the substrate with the patterned first mask layer.

Also provided is a method of fabricating a semiconductor device that includes forming a hard mask layer over a semiconductor substrate, forming a dummy layer over the hard mask layer, patterning a first photoresist layer with a first photomask, patterning the dummy layer using the first photoresist layer to form a first dummy feature and a second dummy feature, removing the first photoresist layer, forming a spacer layer covering the first and second dummy features, patterning a second photoresist layer with a second photomask that protects a first portion of the spacer layer covering the second dummy feature, removing a second portion of the spacer layer covering a top portion of the first dummy feature such that a third portion of the spacer layer remains on side portions of the first dummy feature, removing the first dummy feature, removing the second photoresist layer, patterning a third photoresist layer with a third photomask that protects a middle section of the third portion of the spacer layer and the second dummy feature, removing ends of the third portion of the spacer layer thereby forming a plurality of spacer fins, removing the third photoresist layer, and patterning the hard mask layer using the plurality of spacer fins as a first mask element and the second dummy feature as a second mask element.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device comprising:
   forming a mask layer over a semiconductor substrate;
   forming a dummy layer having a first dummy feature and a second dummy feature over the mask layer, wherein a width of the first dummy feature does not exceed a width of the second dummy feature;
   forming first and second spacer roofs to cover a top portion of the first and second dummy features, respectively, and forming first and second spacer sleeves to encircle side portions of the first and second dummy features, respectively, wherein the first and second spacer roofs and the first and second spacer sleeves are formed in a same process and include same materials;
   removing the first spacer roof and the first dummy feature while protecting the second dummy feature;
   after removing the first dummy feature, removing a first end portion and a second end portion of the first spacer sleeve to form a plurality of spacer fins; and
   patterning the mask layer using the spacer fins as a first mask element and the second dummy feature as a second mask element.

2. The method of claim 1, wherein forming a dummy layer having a first dummy feature includes forming at least two first dummy features having substantially equal widths, wherein a first pitch is the sum of the width of a first dummy feature and a distance between the two first dummy features.

3. The method of claim 2, wherein a thickness of the first and second spacer sleeves is about ¼ of the first pitch.

4. The method of claim 3, wherein a second pitch is the sum of a width of one of the spacer fins and a distance between adjacent spacer fins, wherein the second pitch is about ½ of the first pitch.

5. The method of claim 1, wherein the spacer roofs and spacer sleeves include one of silicon nitride and silicon oxide.

6. The method of claim 1, wherein the mask layer includes silicon oxy-nitride.

7. The method of claim 1, wherein removing the first spacer roof includes etching the first spacer roof using a dry etching process while protecting the second dummy feature with a photoresist mask.

8. The method of claim 1, wherein removing the first end portion and the second end portion of the first spacer sleeve includes etching away the end portions of the first spacer sleeve while protecting a middle portion of the first spacer sleeve and the second dummy feature with a photoresist mask.

9. A method of fabricating a semiconductor device comprising:
   forming a first mask layer over a semiconductor substrate;
   forming a first dummy layer over the first mask layer;
   forming a second mask layer over the first dummy layer;
   forming a second dummy layer having a first dummy feature and a second dummy feature over the second mask layer, wherein a width of the first dummy feature does not exceed a width of the second dummy feature;
   forming first and second spacer roofs to cover a top portion of the first and second dummy features, respectively, and forming first and second spacer sleeves to surround the first and second dummy features, respectively;
   performing a first etching process to remove the first spacer roof and the first dummy feature while protecting the second dummy feature and the second spacer sleeve;
   performing a second etching process to remove a first portion and a second portion of the first spacer sleeve while protecting a third portion of the first spacer sleeve, the second dummy feature, and the second spacer sleeve, thereby forming a plurality of spacer fins, wherein the third portion is disposed between the first and second portions;
   patterning the second mask layer using the third portion of the first spacer sleeve as a first mask element and the second dummy feature surrounded by the second spacer sleeve as a second mask element;
   patterning the first dummy layer with the patterned second mask layer;
   patterning the first mask layer with the patterned first dummy layer; and
   patterning the substrate with the patterned first mask layer.

10. The method of claim 9, wherein the first mask layer includes silicon nitride.

11. The method of claim 9, wherein the first dummy layer includes one of a polymer and an amorphous carbon film.

12. The method of claim 9, wherein the second mask layer includes an oxide layer and a silicon oxy-nitride layer each having a thickness ranging from about 1 nm to about 30 nm.

13. The method of claim 9, wherein the second dummy layer includes one of a polymer and an amorphous carbon film, the second dummy layer having a thickness ranging from about 50 nm to about 150 nm.

14. The method of claim 9, wherein the first etching process includes a dry etching process, and wherein the second etching process includes a dry etching process.

15. A method of fabricating a semiconductor device comprising:
- forming a hard mask layer over a semiconductor substrate;
- forming a dummy layer over the hard mask layer;
- patterning a first photoresist layer with a first photomask;
- patterning the dummy layer using the first photoresist layer to form a first dummy feature and a second dummy feature;
- removing the first photoresist layer;
- forming a spacer layer covering the first and second dummy features;
- patterning a second photoresist layer with a second photomask that protects a first portion of the spacer layer covering the second dummy feature;
- removing a second portion of the spacer layer covering a top portion of the first dummy feature such that a third portion of the spacer layer remains on side portions of the first dummy feature;
- removing the first dummy feature;
- removing the second photoresist layer;
- patterning a third photoresist layer with a third photomask that protects a middle section of the third portion of the spacer layer and the second dummy feature;
- removing ends of the third portion of the spacer layer thereby forming a plurality of spacer fins;
- removing the third photoresist layer; and
- patterning the hard mask layer using the plurality of spacer fins as a first mask element and the second dummy feature as a second mask element.

16. The method of claim 15, wherein the first photomask includes a first opaque region and a second opaque region, and a width of the first opaque region does not exceed a width of the second opaque region, wherein the first opaque region corresponds to the first dummy feature and the second opaque region corresponds to the second dummy feature.

17. The method of claim 15, wherein the second dummy feature is used as an alignment mark, and wherein patterning the second photoresist layer includes aligning the second photomask with the alignment mark.

18. The method of claim 17, wherein patterning the third photoresist layer includes aligning the third photomask with the alignment mark.

19. The method of claim 15, wherein the first dummy feature includes at least two first dummy features having substantially equal widths and separated by a distance, wherein a pitch is the sum of the width of one first dummy feature and the distance.

20. The method of claim 19, wherein a thickness of the spacer layer is about ¼ of the pitch.

* * * * *